(12) United States Patent
Nguyen et al.

(10) Patent No.: US 7,190,611 B2
(45) Date of Patent: Mar. 13, 2007

(54) SPIN-TRANSFER MULTILAYER STACK CONTAINING MAGNETIC LAYERS WITH RESETTABLE MAGNETIZATION

(75) Inventors: Paul P. Nguyen, San Jose, CA (US); Yiming Huai, Pleasanton, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 10/338,148

(22) Filed: Jan. 7, 2003

(65) Prior Publication Data

US 2004/0130936 A1  Jul. 8, 2004

(51) Int. Cl.
  *G11C 11/00* (2006.01)
  *H01L 43/00* (2006.01)
(52) U.S. Cl. .................. 365/158; 365/171; 257/421; 257/422
(58) Field of Classification Search ........... 365/158, 365/171; 257/421, 422
  See application file for complete search history.

(56) References Cited

U.S. PATENT DOCUMENTS

| | | | |
|---|---|---|---|
| 5,695,864 A | 12/1997 | Slonczewski | |
| 6,256,223 B1 | 7/2001 | Sun | |
| 6,532,164 B2 | 3/2003 | Redon et al. ............... | 365/171 |
| 6,593,608 B1 * | 7/2003 | Sharma et al. ............. | 257/421 |
| 6,714,444 B2 | 3/2004 | Huai et al. | |
| 6,744,086 B2 * | 6/2004 | Daughton et al. .......... | 257/421 |
| 2002/0105827 A1 | 8/2002 | Redon et al. ............... | 365/173 |
| 2003/0007398 A1 | 1/2003 | Daughton et al. .......... | 257/295 |
| 2003/0059588 A1 | 3/2003 | Hannah et al. ............. | 365/158 |

OTHER PUBLICATIONS

F.J. Albert et al., Spin-polarized current switching of a Co thin film nanmagnet, Applied Physics Letters, vol. 77, No. 23, pp. 3809-3811, Dec. 4, 2000.
L. Berger, Emission of spin waves by a magnetic multilayer traversed by a current, Physical Review B, vol. 54, No. 13, pp. 9353-9358, Oct. 1, 1996.
J. Daughton, Mangetoresistive Random Access Memory (MRAM), Copyright Feb. 4, 2000.
J. Grollier et al., Spin-polarized current induced switching in Co/Cu/Co pillars, Applied Physics Letters, vol. 78, No. 23, pp. 3663, Jun. 4, 2001.

(Continued)

*Primary Examiner*—Son L. Mai
(74) *Attorney, Agent, or Firm*—Sawyer Law Group LLP

(57) ABSTRACT

A magnetic element for a high-density memory array includes a resettable layer and a storage layer. The resettable layer has a magnetization that is set in a selected direction by at least one externally generated magnetic field. The storage layer has at least one magnetic easy axis and a magnetization that changes direction based on the spin-transfer effect when a write current passes through the magnetic element. An alternative embodiment of the magnetic element includes an additional multilayer structure formed from a tunneling barrier layer, a pinned magnetic layer and an antiferromagnetic layer that pins the magnetization of the pinned layer in a predetermined direction. Another alternative embodiment of the magnetic element includes an additional multilayer structure that is formed from a tunneling barrier layer and a second resettable layer having a magnetic moment that is different from the magnetic moment of the resettable layer of the basic embodiment.

63 Claims, 10 Drawing Sheets

OTHER PUBLICATIONS

D. J Mapps et al., A Non-Volatile Solid-State Memory using the Magnetic Spin-Dependent-Tunnelling Effect, Datatech, pp. 25-28.

J.C. Slonczewski, Current-driven excitation of magnetic multilayers, Journal of Magnetism and Magnetic Materials 159 (1996) L1-L7.

S. Soeya et al., Development of half-metallic ultrathin $Fe_3O_4$ films for spin-transport devices, Applied Physics Letters, vol. 80, No. 5, pp. 823-825, Feb. 4, 2002.

J.F. Albert, et al, "Polarized Current Switching of a CO Thin Film Nanomagnet", American Institute of Physics, vol. 77, Dec. 4, 2000, pp. 3809-3811

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation of Magnetic Multilayers", Journal of Mangetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

\* cited by examiner

SPIN-TRANSFER MULTILAYER STACK CONTAINING MAGNETIC LAYERS WITH RESETTABLE MAGNETIZATION

BACKGROUND OF THE INVENTION

1. Field of the Invention

The invention relates to magnetic memory systems. More particularly, the present invention relates to a method and system for providing an element that employs a spin-transfer effect in switching and that can be used in a magnetic memory, such as a magnetic random access memory ("MRAM").

2. Description of the Related Art

Magnetic memories are used for storing data. One type of memory element of interest utilizes magnetoresistance properties of a magnetic element for storing data. FIGS. 1A and 1B respectively depict cross sectional views of a conventional spin valve magnetic element 100 and a conventional spin tunneling junction magnetic element 100'. As shown in FIG. 1A, conventional spin valve magnetic element 100 includes a conventional antiferromagnetic (AFM) layer 102, a conventional pinned layer 104, a conventional spacer layer 106, and a conventional free layer 108. Conventional pinned layer 104 and conventional free layer 108 are ferromagnetic. Conventional spacer layer 106 is nonmagnetic and is conductive. AFM layer 102 is used to fix, or pin, the magnetization of the pinned layer 104 in a particular direction. The magnetization of free layer 108 is free to rotate, typically in response to an external field.

Portions of conventional spin tunneling junction magnetic element 100' are analogous to conventional spin valve magnetic element 100. Accordingly, conventional spin tunneling junction magnetic element 100' includes an AFM layer 102', a conventional pinned layer 104', an insulating barrier layer 106' and a free layer 108', as shown in FIG. 1B. Conventional barrier layer 106' is thin enough for electrons to tunnel through.

Depending upon the orientations of the magnetizations of free layer 108 (or 108') and pinned layer 104 (or 104', the resistance of conventional magnetic element 100 (or 100') changes. For example, when the magnetizations of free layer 108 and pinned layer 104 are parallel, the resistance of conventional spin valve 100 is low. When the magnetizations of free layer 108 and pinned layer 104 are antiparallel, the resistance of conventional spin valve 100 is high. Similarly, when the magnetizations of free layer 108' and pinned layer 104' are parallel, the resistance of conventional spin tunneling junction 100' is low. When the magnetizations of free layer 108' and pinned layer 104' are antiparallel, the resistance of conventional spin tunneling junction 100' is high.

In order to sense the resistance of either conventional magnetic element 100 or 100', current is driven through the magnetic element. For conventional magnetic element 100, current can be driven through the magnetic element 100 in one of two configurations: current-in-plane (CIP) and current-perpendicular-to-the-plane (CPP). For conventional spin tunneling junction 100', however, current is driven through conventional spin tunneling junction 100' using only the CPP configuration. For the CIP configuration, current is driven parallel to the layers of conventional spin valve 100. Thus, as viewed in FIG. 1A, current is driven from left to right or right to left for the CIP configuration. For the CPP configuration, current is driven perpendicular to the layers of conventional magnetic element 100 (or 100). Accordingly, as viewed in FIG. 1A or 1B, current is driven up or down for the CPP configuration. The CPP configuration is used in MRAM having a conventional spin tunneling junction 100' in a memory cell.

FIG. 2 depicts a conventional memory array 200 using conventional memory cells 220. Each conventional memory cell 220 includes a conventional magnetic element 100 (or 100). Conventional array 200 is shown having four conventional memory cells 220, which are typically spin tunneling junction magnetic elements 100'. As shown in FIG. 2, each memory cell 220 includes a conventional spin tunneling junction 100' and a transistor 222. Memory cells 220 are coupled to a reading/writing column selection 230 via bit lines 232 and 234 and to row selection 250 via word lines 252 and 254. Write lines 260 and 262, which are also depicted in FIG. 2, carry currents that generate external magnetic fields for the corresponding conventional memory cells 220 during writing. Reading/writing column selection 230 is coupled to a write current source 242 and a read current source 240, which are each coupled to a voltage supply Vdd 248 via line 246.

In order to write to conventional memory array 200, a write current $I_{242}$ is applied to bit line 232 (or 234), which is selected by reading/writing column selection 230. A read current Ir 240 is not applied. Both word lines 252 and 254 are disabled, and transistors 222 in all memory cells 220 are disabled. Additionally, one of the write lines 260 and 262 corresponding to the selected memory cell 220 carries a current used to write to the selected memory cell. The combination of the current in write line 260 (or 262) and the current in bit line 232 (or 234) generates a magnetic field that is large enough to switch the direction of magnetization of free layer 108' of the selected cell and thus write to the selected cell. Depending upon the data written to the selected cell, the resulting resistance of the conventional magnetic tunneling junction 100' will be high or low. When reading from a selected cell 220 in array 200, a read current $I_r$ 240 is applied instead. The memory cell selected for reading is determined by row selection 250 and column selection 230. The output voltage of the selected cell is read at output line 244.

Although conventional magnetic memory 200 using conventional spin tunneling junctions 100' can function, there are obstacles at higher memory cell densities. In particular, conventional memory array 200 is written using an external magnetic field that is generated by currents driven through bit and write lines. That is, the magnetization of free layer 108' is switched by the external magnetic field that is generated by currents driven through bit line 232 (or 234) and the write line 260 (or 262). The magnetic field required to switch the magnetization of free layer 108', known as the switching field, is inversely proportional to the width of the conventional magnetic element 100'. As a result, the switching field increases for conventional memories having smaller magnetic elements 100'. Because the switching field is higher for a smaller magnetic element 100', the required current that is to be driven through bit line 232 (or 234) and, in particular, through write line 260 (or 262) increases dramatically for a higher magnetic memory cell density. This relatively large current can cause a host of problems in a conventional magnetic memory array 200, such as increased power consumption and heating. The driving circuits required for driving the current that generates the switching field at a selected memory cell 220 also increase in physical area and complexity. Furthermore, the conventional write currents must be sufficiently large to switch a magnetic memory cell, but not so large that neighboring cells are inadvertently switched. In conventional magnetic memory 200, the operation range for write current between the maximum and minimum values is small, resulting in reliability and consistency problems.

To overcome some of the obstacles associated with high-density magnetic memories described above, a recently discovered phenomenon, the spin-transfer effect, has been utilized. Details of the spin-transfer effect (and the spin-injection method) are disclosed in J. C. Slonczewski, "Current-driven Excitation of Magnetic Multilayers," Journal of Magnetism and Magnetic Materials, Vol. 159, pp. L1–L5 (1996); L. Berger, "Emission of Spin Waves by a Magnetic Multilayer Traversed by a Current," Phys. Rev. B, Vol. 54, p. 9353 (1996), and in F. J. Albert et al., "Spin-polarized Current Switching of a Co Thin Film Nanomagnet," Appl. Phys. Lett., vol. 77, No. 23, pp. 3809–3811 (2000), each of which is incorporated by reference herein.

The spin-transfer effect offers an alternative switching mechanism that has the advantage of being highly localized. In a multilayer structure consisting of ferromagnetic (or ferrimagnetic) layers that are separated by a non-magnetic conducting spacer or an insulating barrier, spin transfer refers to the transferring of spin angular momentum from the spin-polarized conduction electrons, via quantummechanical exchange field, into a ferromagnetic (or ferrimagnetic) layer when an electric current is driven across the multilayers. The spin-transfer effect causes the magnetization vector of the affected ferromagnetic layer to rotate. At high enough current, such a rotation can grow sufficiently large to produce switching (i.e. 180° of rotation). Successful application of the spin-transfer effect to magnetic switching has been demonstrated. Spin-transfer switching has been achieved in a simple giantmagnetoresistance (GMR) spin-transfer structure consisting of Co[thick]/Cu/Co[thin] layers where the Cu layer serves as a spacer separating the two magnetic layers. See, for example, F. J. Albert et al., "Spin-polarized current switching of a Co thin film nanomagnet," Appl. Phys. Lett., vol. 77, No. 23, pp. 3809–3811 (2000) and J. Grollier et al. "Spin-polarized current induced switching in Co/Cu/Co pillars," Applied Physics Letters, Vol. 78, No. 23, p. 3663–3665 (2001). If the thickness of the Cu layer is much less than the spin relaxation length, electrons traveling across the Cu layer retain much of their spin polarization. When electrons travel from the thick to the thin Co layer (with the current flowing in the opposite direction), the thick Co layer serves as a spin reservoir that injects spins into the thin Co layer. Transfer of spin-angular momentum causes the magnetization of the thin Co layer to align parallel to that of the thick Co layer.

When electrons travel from the thin to the thick Co layer, on the other hand, electrons having spins that are parallel to the magnetization direction of the thick Co layer pass without much scattering through the thick Co, but electrons having antiparallel spins are reflected. The reflected antiparallel spins cause the magnetization of the thin Co layer to align antiparallel to the magnetization of the thick Co layer. Thus, by changing the flow direction of the spin-polarized current, the magnetization of the thin Co layer can be repeatedly switched to be parallel and antiparallel to the magnetization of the thick Co layer.

The spin-transfer effect can be used in a CPP configuration as an alternative to or in addition to using an external switching field to switch the direction of magnetization of free layer 108 (or 108) of a conventional spin valve 100 (or a conventional spin tunneling junction 100). The spin-transfer effect dominates other mechanisms and thus becomes observable when the dimensions of conventional magnetic element 100 (or 100') are small, in the range of few hundred nanometers. Consequently, the spin-transfer effect is suitable for higher density magnetic memories having smaller magnetic elements 100 (or 100').

For example, switching the magnetization of a conventional free layer 108 in conventional spin valve 100 using spin transfer can be carried out as follows. The magnetization of conventional free layer 108 is assumed to be initially antiparallel to conventional pinned layer 104. Current can be driven from conventional free layer 108 to conventional pinned layer 104 to switch the magnetization of conventional free layer 108 so that it is parallel to the magnetization of conventional pinned layer 104. When current is driven from conventional free layer 108 to conventional pinned layer 104, conduction electrons travel from conventional pinned layer 104 to conventional free layer 108. The majority electrons traveling from conventional pinned layer 104 have their spins polarized in the same direction as the magnetization of conventional pinned layer 104 and interact with the magnetic moments of conventional free layer 108 around the interfacial region between conventional free layer 108 and conventional spacer layer 106. As a result, the electrons transfer their spin angular momentum to conventional free layer 108. If the electrons transfer sufficient angular momentum, the magnetization of conventional free layer 108 is switched to be parallel to the magnetization of conventional free layer 104.

Alternatively, current can be driven from conventional pinned layer 104 to conventional free layer 108 to switch the magnetization of conventional free layer 108 to be antiparallel to the magnetization of conventional pinned layer 104. In this situation, the magnetization of free layer 108 is assumed to be initially parallel to the magnetization of pinned layer 104. When current is driven from conventional pinned layer 104 to conventional free layer 108, conduction electrons travel in the opposite direction. The majority electrons from conventional free layer 108 are transmitted through conventional pinned layer 104 without much scattering because their spins are polarized parallel to the magnetization of conventional pinned layer 104. The minority electrons that have spins that are polarized antiparallel to the original magnetization of conventional free layer 108 and conventional pinned layer 104, however, will be reflected from conventional pinned layer 104 and travel back to conventional free layer 108. The minority electrons reflected by conventional pinned layer 104 interact with magnetic moments of conventional free layer 108 and transfer at least a portion of their spin-angular momentum to conventional free layer 108. If the electrons transfer sufficient angular momentum to conventional free layer 108, the magnetization of free layer 108 is switched to be antiparallel to the magnetization of conventional pinned layer 104.

In the CPP configuration, therefore, a current driven through a conventional magnetic element 100 (or 100) can switch the direction of magnetization of free layer 108 (or 108) using the spin-transfer effect. That is, the spin-transfer effect can be used to write to a magnetic element in a magnetic memory using a local current confined only to the selected magnetic element. Thus, writing using the spin-transfer effect is localized and, hence, generates less cross talk. Spin-transfer switching is also more reliable because spin-transfer results in a high effective field in a conventional magnetic element 100 (or 100'). Additionally, for a magnetic element 100 (or 100') having a small enough size, the current required to switch the magnetization using the spin-transfer effect can be significantly less than the current required to generate a switching field in conventional magnetic memory array 200. Consequently, there is less power consumption when writing.

Although the spin-transfer effect can be advantageously used to switch the direction of the magnetization of conventional free layer 108 (or 108'), there are barriers to using the spin-transfer effect for a conventional magnetic element 100 (or 100') in a memory. For a conventional spin valve magnetic element 100, the CPP configuration results in a significantly reduced signal. For example, the magnetoresistance ratio for the CPP configuration of a conventional spin valve 100 is only approximately two percent. Moreover, the total resistance of a conventional spin valve magnetic element 100 is low. Thus, the read signal output by a conventional spin valve magnetic element 100 is very low. Consequently, although the spin-transfer effect can be used to write to a conventional spin valve magnetic element 100, the output signal when reading from the conventional spin valve 100 is so low that it is difficult to use a conventional spin valve magnetic element 100 in a magnetic memory that is written using the spin-transfer effect.

On the other hand, a conventional spin tunneling junction magnetic element 100' has a large resistance-area product (Ra), that is typically on the order of $k\Omega\mu m^2$, and hence, can produce a large output signal in a magnetic memory. The high current density that is required for producing the spin-transfer effect in a conventional spin tunneling junction, however, could destroy its thin insulating barrier due to ohmic dissipation. Moreover, the spin-transfer effect has not been observed in a conventional spin tunneling junction magnetic element 100' at room temperature. Thus, it may be impossible to use the spin-transfer effect for writing to a magnetic memory consisting of conventional spin tunneling junction magnetic elements 100'.

As used herein, the term "spin-transfer stack" is defined to be any two-terminal multilayer structure that utilizes the spin-transfer effect for switching the magnetization of a ferromagnetic (ferrimagnetic or sperimagnetic) layer. The term "two-terminal multilayer structure (or device)", as used herein, is defined to be a multilayer structure (or device) that has one bottom lead in contact with a bottom layer of a multilayer structure and one top lead in contact with a top layer of the multilayer structure, and with current driven between the bottom and top lead through the multilayer structure. In contrast, U.S. Pat. No. 5,695,864 to Slonczewski discloses a three-terminal device using spin-transfer for switching. The structure and operational principles of such a three terminal device are different from the spin-transfer stack devices described herein. All spin-transfer stack devices referred to herein will be assumed to be two-terminal, unless otherwise noted.

To date, several types of two-terminal spin-transfer stack devices have been proposed. A first type of two-terminal spin-transfer stack device is referred to herein as a single-spacer spin-transfer stack device. A second type of two-terminal spin-transfer stack device is referred to herein as a single-barrier & dual barrier spin-transfer stack device. A third type of two-terminal spin-transfer stack device is referred to herein as a spacer-barrier spin-transfer stack device.

An exemplary single-spacer spin-transfer stack device is formed having a fixed magnetic layer/Cu spacer/Free magnetic layer. Variations of a single-spacer spin-transfer stack device include additions of antiferromagnetic layers for pinning and synthetic antiferromagnets (such as CoFe[20A]/Ru[8.4A]/CoFe[22A]) for reducing magnetostatic coupling between the layers. The single-spacer spin-transfer stack type suffers numerous disadvantages, including an extremely small signal, a low resistance, and a high switching current.

An exemplary single-barrier stack device is formed having a Fixed magnetic layer/Tunnel barrier/Free magnetic nanoparticle. See, for example, U.S. Pat. No. 6,256,223 to Sun. An exemplary dual-barrier stack device is formed having a Fixed magnetic layer/Tunnel barrier/Free magnetic nanoparticle/Tunnel barrier/Fixed magnetic layer. See, for example, U.S. Pat. No. 6,256,223 to Sun. Variations to this type of two-terminal spin-transfer stack device include additions of antiferromagnetic layers for pinning and synthetic antiferromagnets for reducing magnetostatic coupling between the layers. The single-barrier and dual-barrier spin-transfer stack devices suffer from numerous disadvantages, including an extremely high resistance, a high switching current, an unreliable method of fabrication, and a lack of working experimental evidence of spin-transfer effect switching across tunnel barrier(s) at room temperature.

An exemplary spacer-barrier stack device is formed having a Fixed magnetic layer/Conducting spacer/Free magnetic layer/Low-resistance tunnel barrier/Fixed magnetic layer. See, for example, copending and co-assigned U.S. patent application Ser. No. 10/213,537, filed Aug. 6, 2002, entitled Magnetic Element Utilizing Spin Transfer and an MRAM Device Using the Magnetic Element, which is incorporated by reference herein. Variations to a spacer-barrier spin-transfer stack device include additions of antiferromagnetic layers for pinning and synthetic antiferromagnets for reducing magnetostatic coupling between the layers. The spacer-barrier stack types address most of the problems of the other spin-transfer stack types. The low-resistance tunnel barrier significantly increases the read signal, but yet keeps the total stack resistance low. Unlike spin-transfer switching across a tunnel barrier, spin-transfer switching across a conducting spacer at room temperature has been experimentally observed. Consequently, a spacer-barrier spin-transfer stack is guaranteed to switch because it contains a conducting spacer arrangement.

The current density required for switching the magnetization of the free layer in a spin-transfer stack device is normally less in the forward-bias switching mode (in which the current flows from the free layer to the pinned layer, which is the same as electrons flowing from the pinned layer to the free layer) than in the reverse-bias switching mode. Consequently, to minimize the switching current density of a spin-transfer stack device, what is needed is a spin-transfer stack device having a magnetization of the free layer that can be switched back and forth (and/or to any angle) using only the forward-bias switching mode.

Further, existing spin-transfer stack devices require current flow to be possible in both directions for writing (i.e., switching). The requirements of a bi-directional current exclude use of a uni-directional electrical element (a rectifier) in series with a spin-transfer stack for device selection in an array. Thus, what is also needed is a spin-transfer stack device that allows cell writing (i.e., switching) using a uni-directional current and using uni-directional elements, thereby decreasing process complexity, reducing cell size and/or enhancing performance.

Further still, what is needed is a spin-transfer stack device capable of storing more than one bit per device (or cell), thereby increasing memory density.

BRIEF SUMMARY OF THE INVENTION

The present invention provides a spin-transfer stack device having a magnetization of the free layer that can be switched back and forth (and/or to any angle) using only the forward-bias switching mode, thereby minimizing the switching current density of a spin-transfer stack device. The present invention also provides a spin-transfer stack device that allows cell writing (i.e., switching) using a uni-directional current and using uni-directional elements, thereby decreasing process complexity, reducing cell size and/or enhancing performance. Additionally, the present invention provides a spin-transfer stack device capable of storing more than one bit per device (or cell), thereby increasing memory density.

The advantages of the present invention are provided by a magnetic element having a Basic Structure embodiment that includes a resettable layer, a storage layer and a spacing layer. The resettable layer has a first magnetization that is set in a selected direction by at least one magnetic field. Each magnetic field is generated externally to the resettable layer. The resettable layer is magnetic with a magnetization that is set in a desired direction using an external magnetic field that is preferably less than about 20 Oe. According to the invention, at least a portion of the resettable layer can be formed from one of a ferromagnetic material, a ferrimagnetic material, a sperimagnetic material, and a half-metallic material. Alternatively, the resettable layer is formed from a synthetic antiferromagnet.

The storage layer has at least one magnetic easy axis and has a second magnetization that changes direction based on a spin-transfer effect when a write current passes through the magnetic element, preferably in only a forward-bias switching mode direction. At least a portion of the storage layer can be formed from one of a ferromagnetic material, a ferrimagnetic material, a sperimagnetic material, and a half-metallic material. Alternatively, the storage layer can be formed from a synthetic antiferromagnet. Another alternative provides that the storage layer has at least one magnetic shape anisotropy. Yet another alternative provides that the storage layer has a first shape and the resettable layer has a second shape that is different from the first shape. For example, the storage layer can have a shape that induces at least one magnetic shape anisotropy, while the resettable layer can have a magnetically isotropic shape.

The spacing layer is formed between the resettable layer and the storage layer. According to one configuration of the Basic Structure embodiment of the present invention, the spacing layer is a tunneling barrier layer. An alternative configuration of the Basic Structure embodiment of the present invention can include a layer of high spin-polarization material formed between the resettable layer and the tunneling barrier layer. In another alternative configuration of the Basic Structure embodiment of the present invention, the spacing layer is a conductive spacer layer. Still another alternative configuration of the Basic Structure embodiment of the present invention includes a layer of high spin-polarization material formed between the resettable layer and the conductive spacer layer. An electrical uni-directional element, i.e., a rectifier, can be connected in electrical series with the storage layer and the resettable layer.

According to the present invention, the magnetic element can have a Dual Structure embodiment in which the storage layer has a first side and a second side, such that the first side of the storage layer is closer to the resettable layer than the second side of the storage layer. A multilayer structure is then formed on the second side of the storage layer. The multilayer structure includes a second spacing layer formed adjacent to the storage layer, a pinned magnetic layer having a third magnetization, and an antiferromagnetic layer. The pinned magnetic layer can be a synthetic antiferromagnet. An electrical uni-directional element can be connected in electrical series with the storage layer and the multilayer structure.

In one configuration of the Dual Structure embodiment of the present invention, the second spacing layer is a tunneling barrier layer. In an alternative configuration of the Dual Structure embodiment of the present invention, the second spacing layer is a conductive spacer layer.

According to the present invention, the magnetic element can have a Double Resettable Layers (DRL) Structure embodiment in which the storage layer has a first side and a second side, such that the first side of the storage layer is closer to the resettable layer than the second side of the storage layer. A multilayer structure is then formed on the second side of the storage layer. The multilayer structure includes a tunneling barrier layer and a second resettable layer. The tunneling barrier layer is formed adjacent to the storage layer. The second resettable layer has a third magnetization and a magnetic moment that is different from a magnetic moment of the first resettable layer having the first magnetization. The first magnetization of the first resettable layer and the third magnetization of the second resettable layer can be set in a selected direction by at least one magnetic field, such that each magnetic field is generated by a current that is external to the magnetic element. The second resettable layer can have a magnetically isotropic shape. Additionally or alternatively, the second resettable layer can be formed with a magnetization that is set in a desired direction using an external magnetic field that is preferably less than about 20 Oe. As yet another alternative, the second resettable layer can be a synthetic antiferromagnet.

According to the invention, the Basic Structure, Dual Structure and DRL Structure embodiments can be used in a magnetic memory having a plurality of magnetic cells.

The present invention provides a method for forming a magnetic element in which a resettable layer is formed having a first magnetization that is set in a selected direction by at least one magnetic field. Each magnetic field is generated externally to the resettable layer. A storage layer is formed having at least one magnetic easy axis and having a second magnetization that changes direction based on a spin-transfer effect when a write current passes through the magnetic element. A spacing layer is formed between the resettable layer and the storage layer. According to one configuration of the present invention, the storage layer has a first side and a second side, such that the first side of the storage layer is closer to the resettable layer than the second side of the storage layer. According to another configuration, the spacing layer is a tunneling barrier layer. According to yet another configuration, the spacing layer is a conductive spacer layer. A multilayer structure is then formed on the second side of the storage layer. The multilayer structure can be formed by forming a second spacing layer adjacent to the storage layer, a pinned magnetic layer having the third magnetization. An antiferromagnetic layer can be formed that pins the third magnetization in a predetermined direction. According to one configuration, the second spacing layer is a tunneling barrier layer. According to another configuration, the spacing layer is a conductive spacer layer. A second resettable layer is formed having a third magnetization, such that the second resettable layer has a magnetic moment that is different from a magnetic moment of the resettable layer having the first magnetization. An electrical uni-directional element can be formed in electrical series with the storage layer and the multilayer structure.

According to the present invention, the storage layer can be formed to have at least one magnetic shape anisotropy. Further, the storage layer can be formed to have more than one easy magnetic axis. Further still, the storage layer can be formed to have a first shape and the resettable layer can be formed to have a second shape that is different from the first shape. In this regard, the storage layer can be formed to have a shape that induces at least one magnetic shape anisotropy and the resettable layer can be formed to have a magnetically isotropic shape.

The present invention also provides a method for writing information to a magnetic element that includes a resettable layer having a first magnetization that is set in a selected direction by at least one magnetic field. Each magnetic field is generated by a current flowing externally to the magnetic element. The magnetic element also includes a storage layer having at least one magnetic easy axis and having a second magnetization that changes direction based on a spin-transfer effect when a write current passes through the magnetic element. The magnetic element further includes a spacing layer formed between the resettable layer and the storage layer. The spacing layer can be a tunneling barrier layer or, alternatively, a conductive spacer layer. The method for writing includes a step of setting the first magnetization of the resettable layer in the selected direction by generating the external magnetic field. The direction of the second magnetization of the storage layer is changed by passing a write current through the magnetic element, such that the write current has a magnitude that is greater than or equal to a magnitude of a current that switches the magnetization of the storage layer. The step of setting the first magnetization of the resettable layer includes a step of passing a setting current through a conductive line that is in proximity to the resettable layer for generating the external magnetic field. The step of setting the first magnetization of the resettable layer includes a step of generating a plurality of external magnetic fields. The step of generating the plurality of external magnetic fields includes a step of passing a setting current through a conductive line corresponding to each magnetic field, such that each conductive line is in proximity to the resettable layer.

The storage layer of the magnetic element has a first side and a second side, such that the first side of the storage layer is closer to the resettable layer than the second side of the storage layer. The magnetic element further includes a multilayer structure that is formed on the second side of the storage layer. One embodiment of the magnetic element includes a pinned magnetic layer having a third magnetization, an antiferromagnetic layer that pins the third magnetization in a predetermined direction and a second spacer layer between the pinned magnetic layer and the storage layer. The second spacer layer can be a tunneling barrier layer or, alternatively, a conductive spacer layer.

The present invention provides a method for reading a magnetic element having at least one resettable layer, such that each resettable layer has a magnetization that is set in a selected direction by at least one magnetic field. Each magnetic field is generated by a current flowing externally to the magnetic element. The magnetic element also includes a storage layer having at least one magnetic easy axis and having a second magnetization that changes direction based on a spin-transfer effect when a write current is passed through the magnetic element. The method for reading includes a step of setting the magnetization of each resettable layer in a first selected direction by generating at least one external magnetic field. A first read current is passed through the magnetic element while the magnetization of each resettable layer is in the first selected direction. Each read current has a magnitude that is less than a magnitude of a current that switches the magnetization of the storage layer. The magnetization of each resettable layer is set in a second selected direction by generating at least one external magnetic field. A second read current is passed through the magnetic element while the magnetization of each resettable layer is in the second selected direction. The second selected direction is opposite the first selected direction. A voltage is detected across the magnetic element when each respective read current is passed through the magnetic element, and an information value stored in the magnetic cell is determined based on the detected voltages. A first read current is passed through the magnetic element while the magnetization of each resettable layer is set in a first direction. A second read current is passed through the magnetic element while the magnetization of each resettable layer is set in a second direction, such that the second direction being opposite from the first direction. The step of determining the stored information value of the magnetic element includes a step of comparing the detected voltages.

The present invention provides an alternative method for reading a magnetic element that includes a resettable layer and a storage layer. The resettable layer has a first magnetization that is set in a selected direction by at least one magnetic field. Each magnetic field is generated by a current flowing externally to the magnetic element. The storage layer has at least one magnetic easy axis and has a second magnetization that changes direction based on a spin-transfer effect when a write current passes through the magnetic element. The magnetic element includes a pinned magnetic layer having a third magnetization and an antiferromagnetic layer pins the third magnetization in a predetermined direction. A tunneling barrier layer is formed between the storage layer and the pinned layer. The alternative method for reading includes a step of setting the first magnetization of the resettable layer in the selected direction by generating the external magnetic field. A first read current is passed through the magnetic element, such that the first read current has a magnitude that is less than a magnitude of a current that switches the magnetization of the storage layer. A first voltage is detected across the magnetic element when the first read current is passed through the magnetic element. A write current is passed through the magnetic element, such that the write current has a magnitude that is greater than or equal to the magnitude of the current that switches the magnetization of the storage layer. A second read current is passed through the magnetic element, such that the second read current has a magnitude that is less than the magnitude of the current that switches the magnetization of the storage layer. A second voltage is detected across the magnetic element when the second read current is passed through the magnetic element. An information value stored in the magnetic cell is determined by comparing the first and second detected voltages. The determined information value is written back into the magnetic element after the information value has been determined.

BRIEF DESCRIPTION OF THE DRAWINGS

The present invention is illustrated by way of example and not by limitation in the accompanying figures in which like reference numerals indicate similar elements and in which.

DETAILED DESCRIPTION OF THE INVENTION

Figure 1A:
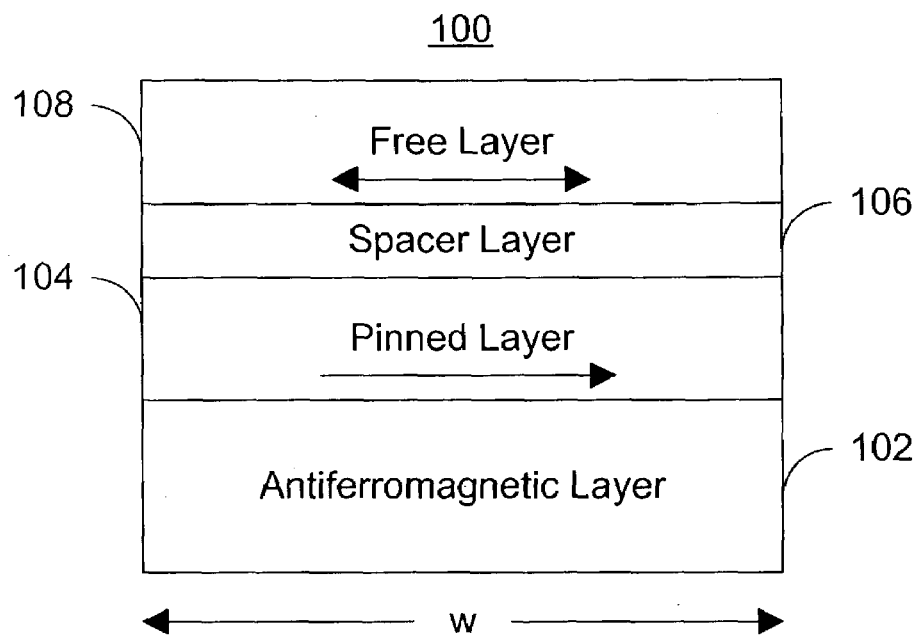
FIGS. 1A and 1B respectively depict cross sectional views of a conventional spin valve magnetic element and a conventional spin tunneling junction magnetic element.
Figure 1B:
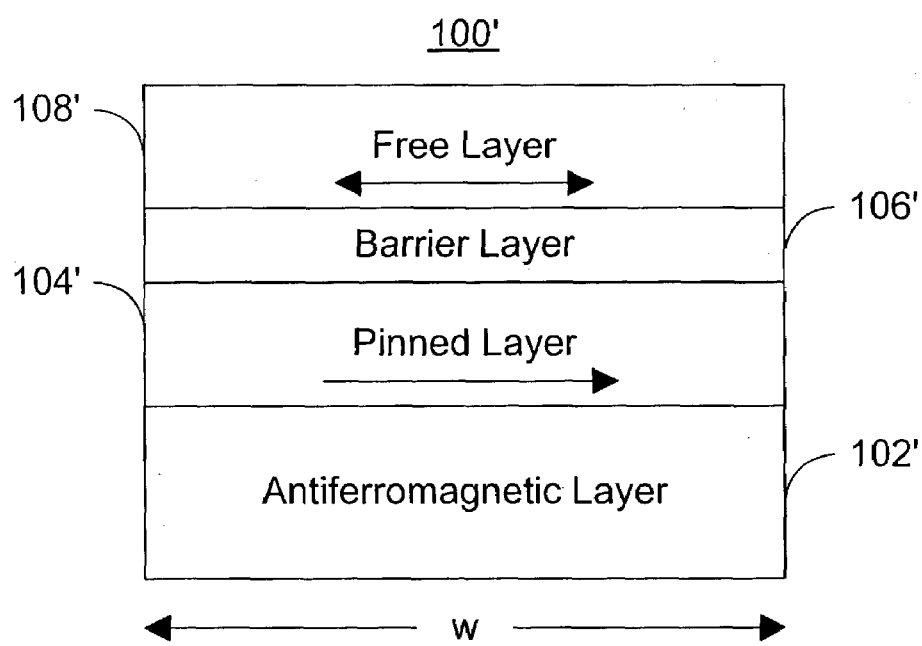
Figure 2:
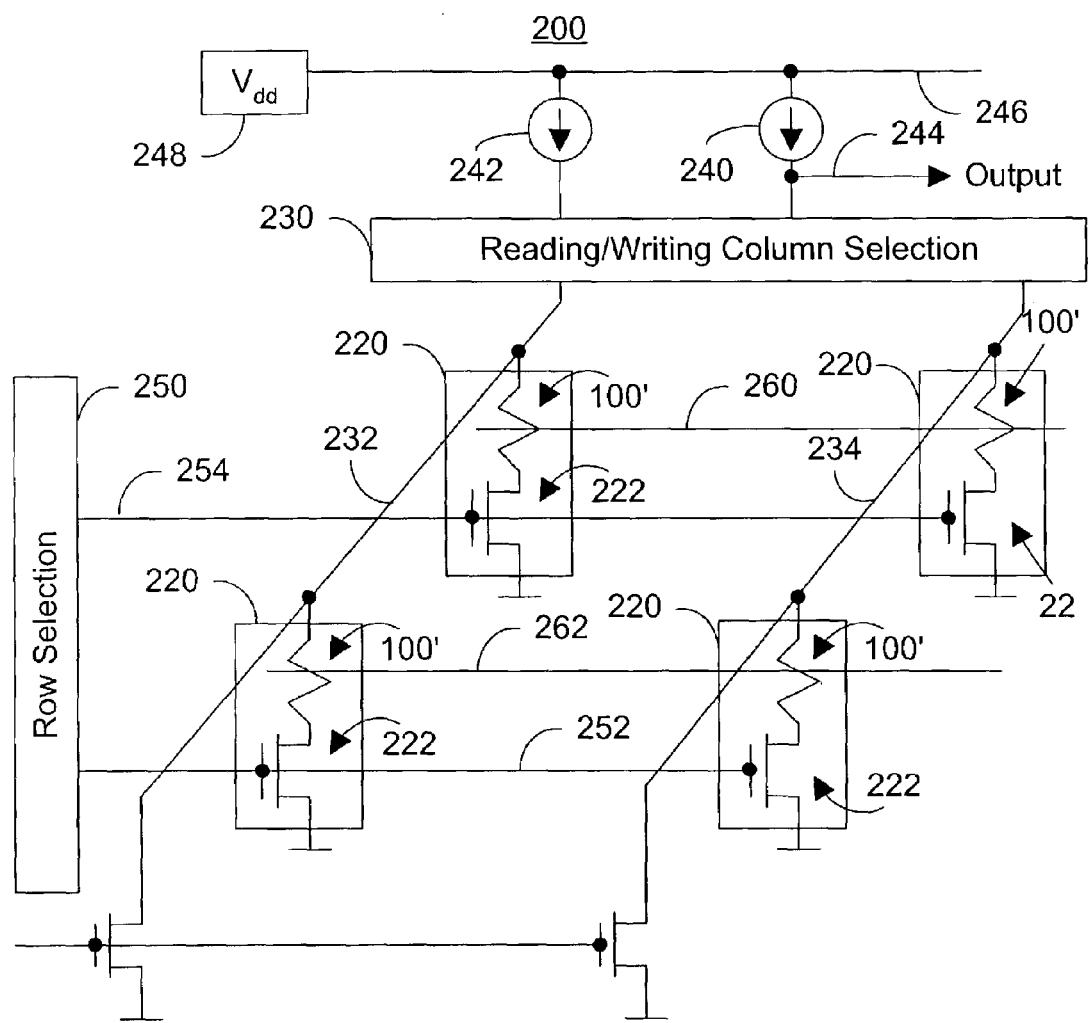
FIG. 2 depicts a conventional memory array using conventional memory cells.

The present invention provides a spin-transfer stack device having a magnetization of the free or storage layer that can be switched back and forth (and/or to any angle) using only the forward-bias switching mode, thereby minimizing the switching current density of a spin-transfer stack device. The present invention also provides a spin-transfer stack device that allows cell writing (i.e., switching) using a uni-directional current and using uni-directional elements, thereby decreasing process complexity, reducing cell size and/or enhancing performance. Additionally, the present invention provides a spin-transfer stack device capable of storing more than one bit per device (or cell), thereby increasing memory density.

The present invention provides a spin-transfer stack device having a pinned layer, referred to herein as a "resettable" layer, that is ferromagnetic, ferrimagnetic or sperimagnetic. The magnetization of the resettable layer should easily be set in a desired direction using a small external magnetic field, preferably below 20 Oe, generated by currents running through conducting lines that are situated nearby, such as bit and/or word lines. A unidirectional current can be applied through the spin-transfer stack in the forward-bias switching mode for rotating the magnetization of the free layer of the spin-transfer stack to be parallel to the magnetization of the resettable layer.

Thus, the switching current threshold for the spin-transfer stack device is reduced because the current is now required to flow through the stack in only one direction, i.e., in the forward-bias direction. A uni-directional element, such as a diode, used for cell selection can also be used in series with the stack to decrease process complexity, reduce cell size and/or enhance performance. Additionally, when a multi-axial anisotropy magnetic material is used for the free layer, the magnetization of the free layer can be switched or rotated to more than two (up or down) orientations, leading to multi-bit storage per stack (or cell, when each cell consists of a spin-transfer stack).

A spin-transfer stack device according to the present invention differs from a conventional MRAM device in that an external magnetic field is generated using only a single line carrying a large current that resets the magnetization direction of resettable layers of all spin-transfer stack device cells along the line. No information in the cells is lost because the resettable layers of the cells are not used to store information as the free layers are used in a conventional MRAM device. The storage layer of a cell is then switched by passing a current through the desired spin-transfer stack. Extremely little interference occurs with neighboring spin-transfer stack cell occurs during a switching operation because the switching current passing through the selected stack is completely localized to the selected stack. The storage layer can always be switched in a forward-bias switching mode with the switching current flowing in only one direction. Switching in the reverse-bias switching mode, however, is also available, albeit much less effective. Thus, the present invention allows use of a uni-directional element, such as a diode, in series with a spin-transfer stack.

Figure 3:
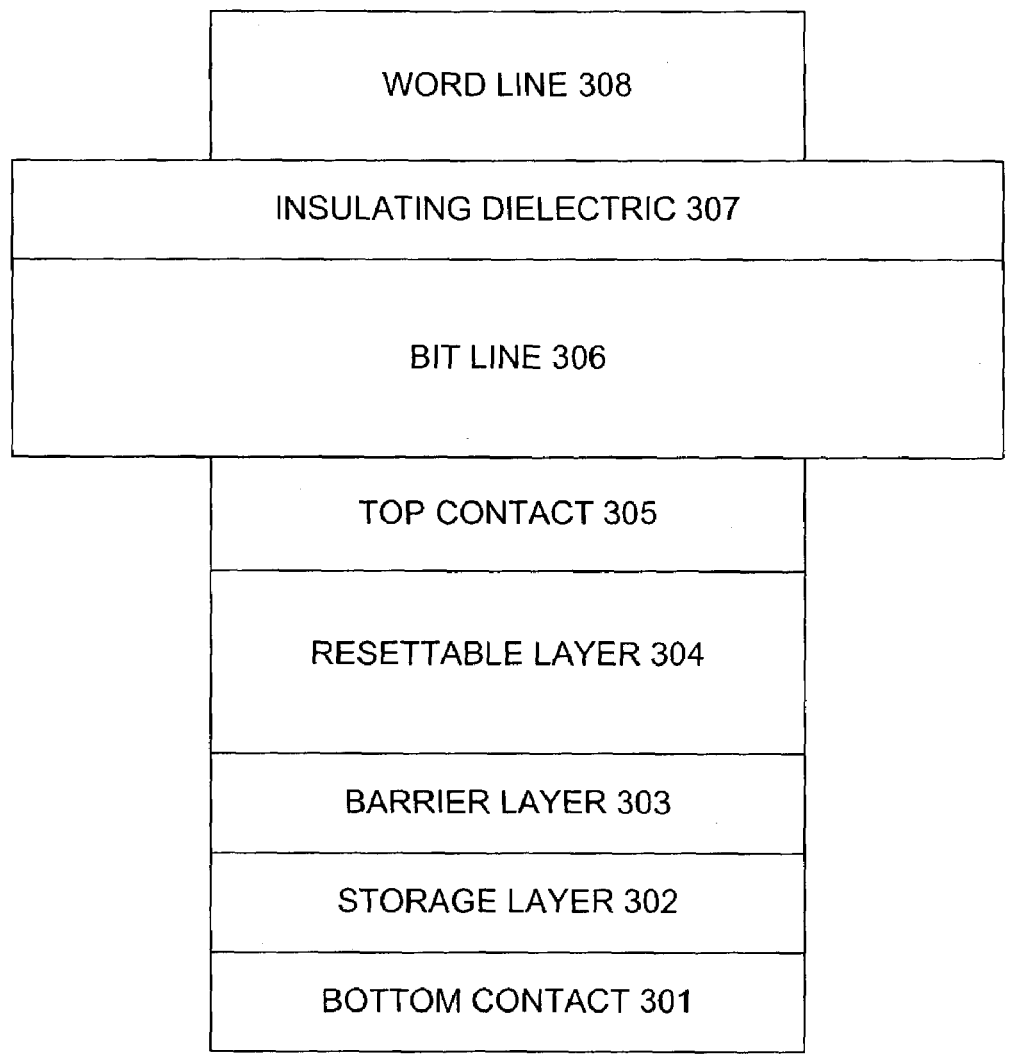
FIG. 3 shows a first exemplary embodiment of a spin-transfer stack device (Basic Structure device) according to the present invention.

FIG. 3 shows a first exemplary embodiment of a spin-transfer stack device 300 according to the present invention. Exemplary spin-transfer stack device 300 will generally be referred to herein as a "Basic Structure" device. Exemplary Basic Structure device 300 includes a bottom contact (or lead) 301, a storage layer 302, a barrier layer 303, a resettable layer 304, and a top contact layer (or lead) 305. FIG. 3 also shows a bit line 306 formed on top contact layer 305, an insulating dielectric layer 307 formed on bit line 306, and a word line 308 formed on dielectric layer 307.

Bottom contact 301 can be formed on a seed layer (not shown) from any metal having a high electrical conductivity, such as Cu, Au, Ag, and/or any of their respective alloys. Bottom contact 301 can be formed to have the same or a different pattern as storage layer 302. Storage layer 302 includes a uni-axial magnetic anisotropy such that the magnetization of storage layer 302 has one easy axis. For exemplary spin-transfer stack device 300, the easy axis of storage layer 302 extends from left to right in FIG. 3. Such uni-axial magnetic anisotropy can be achieved in several ways, including crystalline anisotropy and/or shape anisotropy. Preferably, storage layer 302 is formed to be between 10–50 Å thick or less so that its magnetization is easy to switch.

Barrier layer 303 can be formed from $Al_2O_3$ and should be formed to be sufficiently thin (for example, between about 7–30 Å) for tunneling and for preserving the spin polarization of the tunneling current. Alternatively, barrier layer 303 can be formed from a Cu spacer, in which case layer 303 should be between 5–500 Å thick for preserving the spin polarization of the transport current. Resettable layer 304 is formed from a very soft magnetic material, such as Permalloy or FeZr, with preferably little or no magnetic shape anisotropy so that the magnetization of layer 304 is no longer pinned. Alternatively, resettable layer 304 can be a synthetic antiferromagnet, such as CoFe/Ru/CoFe with interlayer coupling. When resettable layer 304 is a synthetic antiferromagnet, the magnetostatic field from the resettable layer that biases the storage layer 302 is reduced, thereby resulting in a smaller switching current for storage layer 302. Additionally, a smaller external current running in word line 308 (producing the external magnetic field) is required to reset (or rotate) the smaller net moment of the synthetic resettable antiferromagnet. As a result, less power is consumed.

Though not necessary, resettable layer 304 should have an isotropic round shape, thereby minimizing or eliminating shape anisotropy. Preferably, resettable layer 304 should be thicker and/or larger than storage layer 302 so that resettable layer 304 is not affected by the spin-transfer effect switching induced by storage layer 302. Top contact 305 can be formed from any metal having a high electrical conductivity, such as Cu, Au, Ag, and their respective alloys. Accordingly, top contact 305 can have the same or a different pattern as resettable layer 304.

As shown in FIG. 3, bit line 306 extends in the left-right direction, whereas word line 308 can be patterned to extend in a perpendicular direction from bit line 306. Alternatively, word line 308 can be formed to be parallel to the bit line.

To perform a write operation for a Basic Structure device 300, a current is applied to word line 308 to generate a magnetic field that is sufficiently strong (approximately 20–50 Oe) for setting the magnetization of resettable layer 304 in a particular direction, but not strong enough to switch the direction of the magnetization of storage layer 302. When the field is generated by only one word line, the magnetization of resettable layer 304 (and storage layer 302) can point in only two (opposite) directions. While the magnetic field is on, a second current is passed through Basic Structure device 300 which should switch storage layer 302. Preferably, the current flow is in the forward-bias switching direction, i.e., from storage layer 302 to resettable layer 304, even though the current flow in the opposite direction will also work, albeit less effectively. Storage layer 302 should have a magnetic anisotropy with its easy axis aligned along, or at an angle that is less than 90 degrees with, the axis of the external field generated by word line 308. Both the first and second currents are then turned off at the end of the write operation. When resettable layer 304 has a weak anisotropy (preferably with a coercivity of less than about 20 Oe to keep the amplitude of the word-line current low), the anisotropy can hold its magnetization direction in place and, hence, the magnetic field can be turned off before the second current is applied. Note that although the magnetic field generated by the current in word line 308 also resets the magnetization directions of the resettable layers in all of the neighboring cells along word line 308, the storage layers in the unselected neighboring cells are unaffected because the second current, which switches storage layer 302 of the selected cell, is applied only to the selected cell.

To perform a read operation for a Basic Structure device, a current is applied to word line 308 for generating a magnetic field that is strong enough (approximately 20–50 Oe) for setting the magnetization of resettable layer 304 in a particular direction, but not strong enough to switch the direction of the magnetization of storage layer 302. When the field is generated by only one word line, the magnetization of resettable layer 304 (and storage layer 302) can point in only two (opposite) directions. While the magnetic field is on, a second current is passed through the Basic Structure device. Unlike in a write operation, the second current that is used in a read operation has a smaller magnitude than the magnitude of the critical switching current so that storage layer 302 does not switch. When resettable layer 304 has a weak anisotropy (preferably with a coercivity of less than about 20 Oe to keep the amplitude of the word-line current low), the anisotropy can hold its magnetization direction in place and, hence, the magnetic field can be turned off before the second current is applied.

The voltage drop (or resistance) of the stack is obtained from the second current and is temporarily saved elsewhere. The word-line current (and field) is then reversed. A new voltage drop (or new resistance) is obtained from the second current and is used for comparison to the previously saved value. At the end of the read operation, both currents are turned off.

A less reliable, but faster, alternative read operation technique uses a reference read cell having a predetermined fixed resistance. After the first voltage drop (or resistance) of a read operation is detected is obtained (as described above), the voltage drop (or resistance) is compared with the resistance of the reference read cell, instead of being temporarily saved. The second part of a read operation (when the word-line current and field are reversed) is not necessary for this alternative read operation technique. Both read operation techniques described above for a Basic Structure device are non-destructive, that is, the magnetization of storage layer 304 remains unchanged at all times during a read operation.

Figure 4:
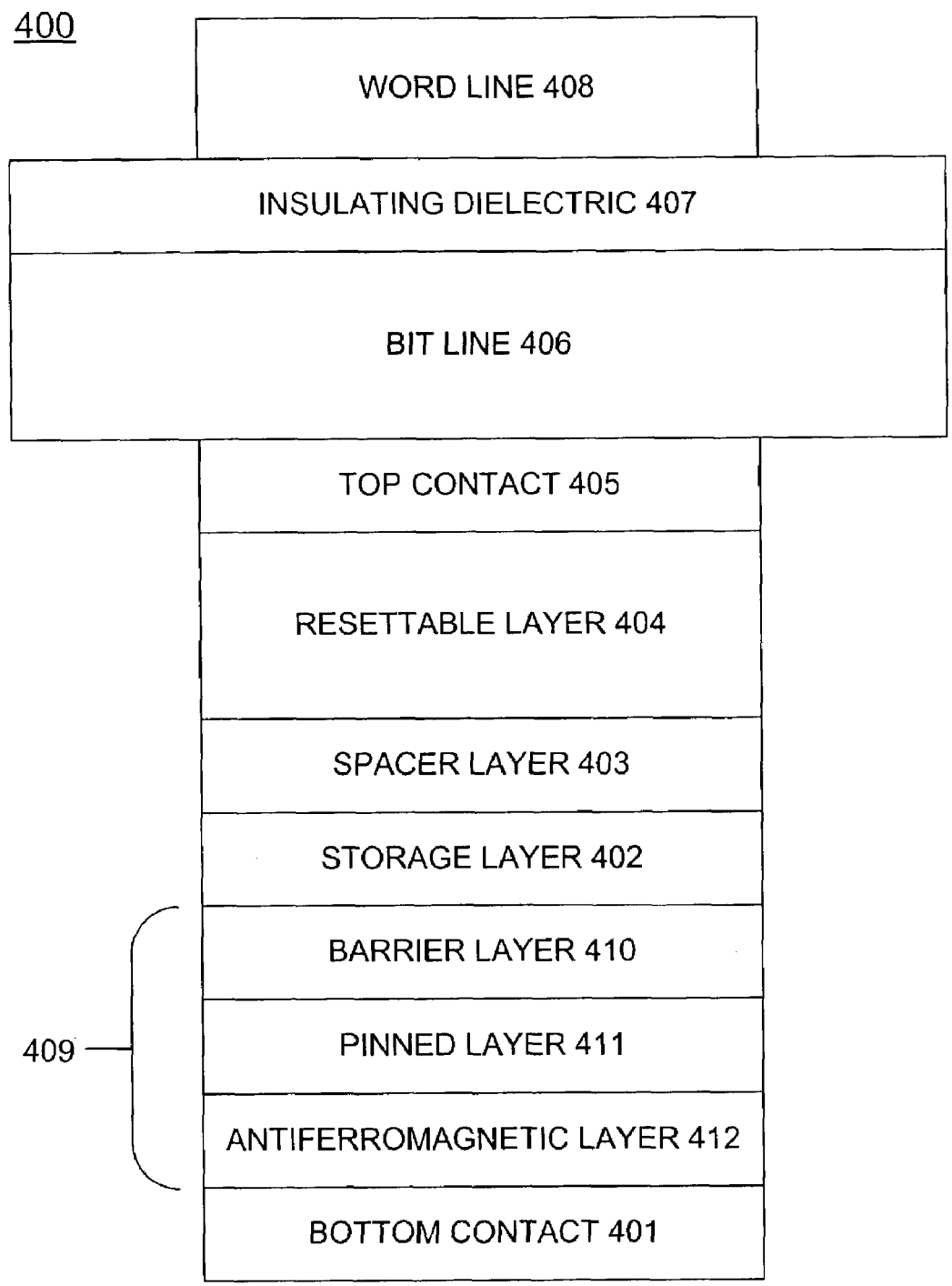
FIG. 4 shows a second exemplary embodiment of a spin-transfer stack device (Dual Structure device) according to the present invention.

FIG. 4 shows a second exemplary embodiment of a spin-transfer stack device 400 according to the present invention. Exemplary spin-transfer stack device 400 will generally be referred to herein as a Dual Structure device. Exemplary Dual Structure device 400 includes a bottom contact (or lead) 401, a multilayer structure 409, a storage layer 402, a conductive spacer layer 403, a resettable layer 404, and a top contact layer (or lead) 405. FIG. 4 also shows a bit line 406 formed on top contact layer 405, an insulating dielectric layer 407 formed on bit line 406, and a word line 408 formed on dielectric layer 407.

As shown in FIG. 4, exemplary Dual Structure device 400 is similar to exemplary Basic Structure device 300 except that the layer separating storage layer 402 and resettable layer 404 is preferably a conducting spacer layer 403; and that a multilayer structure 409 is formed between storage layer 402 and bottom contact 401. The portions of exemplary Dual Structure device 400 that are similar to exemplary Basic Structure device 300 are described above in connection with Basic Structure device 300. Multilayer structure 409 preferably includes a tunneling barrier 410, a pinned layer 411 and an antiferromagnetic layer 412. Tunneling barrier layer 410 is formed adjacent to storage layer 402. Alternatively, a metallic spacer can replace tunneling barrier 410. Pinned magnetic layer 411 is formed adjacent to tunneling barrier 410. Pinned layer 411 is deposited on antiferromagnetic layer 412, such as PtMn, which pins the magnetization of pinned layer 411 in a predetermined fixed direction. Preferably, pinned magnetic layer 411 is a synthetic antiferromagnet. In a synthetic antiferromagnet, the net magnetostatic field emanating from the edges of its magnetic layers are minimized or canceled, and the effects of external magnetic fields are reduced. More importantly, the synthetic antiferromagnetic structure helps minimize the spin-transfer switching effect on storage layer 402 caused by the electrons reflected from pinned layer 411 during a write operation.

A write operation for a Dual Structure device is identical to a write operation for a Basic Structure device. A forward-bias switching current flow is preferred at all times, although a reverse-bias switching current flow will cause switching, albeit less effectively. For a Dual Structure device, a forward-bias switching current flows from storage layer 402 to resettable layer 404.

Unlike a read operation for a Basic Structure device, a read operation (without using reference cells) for a Dual Structure device is destructive as resettable layer 404 no longer participates in producing the read signal, but acts only as a driver layer for switching storage layer 402. The most straightforward of several read operation techniques for a Dual Structure device is when the Dual Structure device is configured to contain a metallic spacer layer 403 between storage layer 402 and resettable layer 404 and to contain a tunneling barrier 410 between storage layer 402 and pinned layer 411. In such a Dual Structure configuration, a current is applied to word line 408 to generate a sufficiently strong magnetic field (approximately 10–50 Oe) to set the magnetization of resettable layer 404 in one of two opposite directions (in the situation that the field is generated by only one word line), but is not strong enough for switching the direction of the magnetization of storage layer 402. While the magnetic field is on, a second current is passed through multilayer structure 409. The second current is less than the critical switching current amplitude so that the magnetization of storage layer 402 does not switch. When resettable layer 404 has a weak anisotropy (preferably with a coercivity of less than about 20 Oe to keep the amplitude of the word-line setting current low) that holds the magnetization direction is place, the magnetic field can be turned off before the second current is applied. The voltage drop (or resistance) of multilayer 409 is obtained from the second current and temporarily saved elsewhere. The amplitude of the second current is then increased to be greater than the critical switching current value in order to switch storage layer 402 to be parallel to resettable layer 404. After switching, the second current is decreased to the previous read-level amplitude, and the voltage drop (or resistance) is obtained for comparison to the saved value. After determining the saved bit value from the comparison, the cell is rewritten with the original bit value using a write operation.

Alternatively, a read operation for a Dual Structure device can be made non-destructive when a reference read cell having a predetermined fixed resistance is used. To perform a non-destructive read operation for a Dual Structure device, a current having amplitude less than the critical switching threshold is passed through multilayer structure 409. The voltage drop (or resistance) is then obtained and compared with the fixed resistance of the reference cell for determining the saved bit state (0 or 1) of the cell. Although faster and non-destructive, this alternative read operation for the Dual stack can be much less reliable than a destructive read operation if there are large variations in cell resistance in a memory array due to manufacturing non-uniformity.

If the spin-transfer switching effect is weak or non-existent across a tunneling barrier at room temperature, a Basic Structure device having a tunneling barrier (i.e., barrier layer 303) will not write effectively. A Basic Structure device having a metallic spacer replacing barrier layer 303 would write well, except that a read signal would be very small. In comparison, a Dual Structure device having a metallic spacer separating storage layer 402 and resettable layer 404 would write well and would maintain a high read signal across tunneling barrier layer 410 separating storage layer 402 and pinned layer 411. Fabrication of a Dual Structure device, however, is more complicated than fabrication of a Basic Structure device because a Dual Structure device has more layers than a Basic Structure device. On the other hand, a metallic spacer layer can be made quite thick (around 100 Å or thicker), thereby providing extra flexibility during the fabrication of a Dual Structure device, as will be described later.

Figure 5:
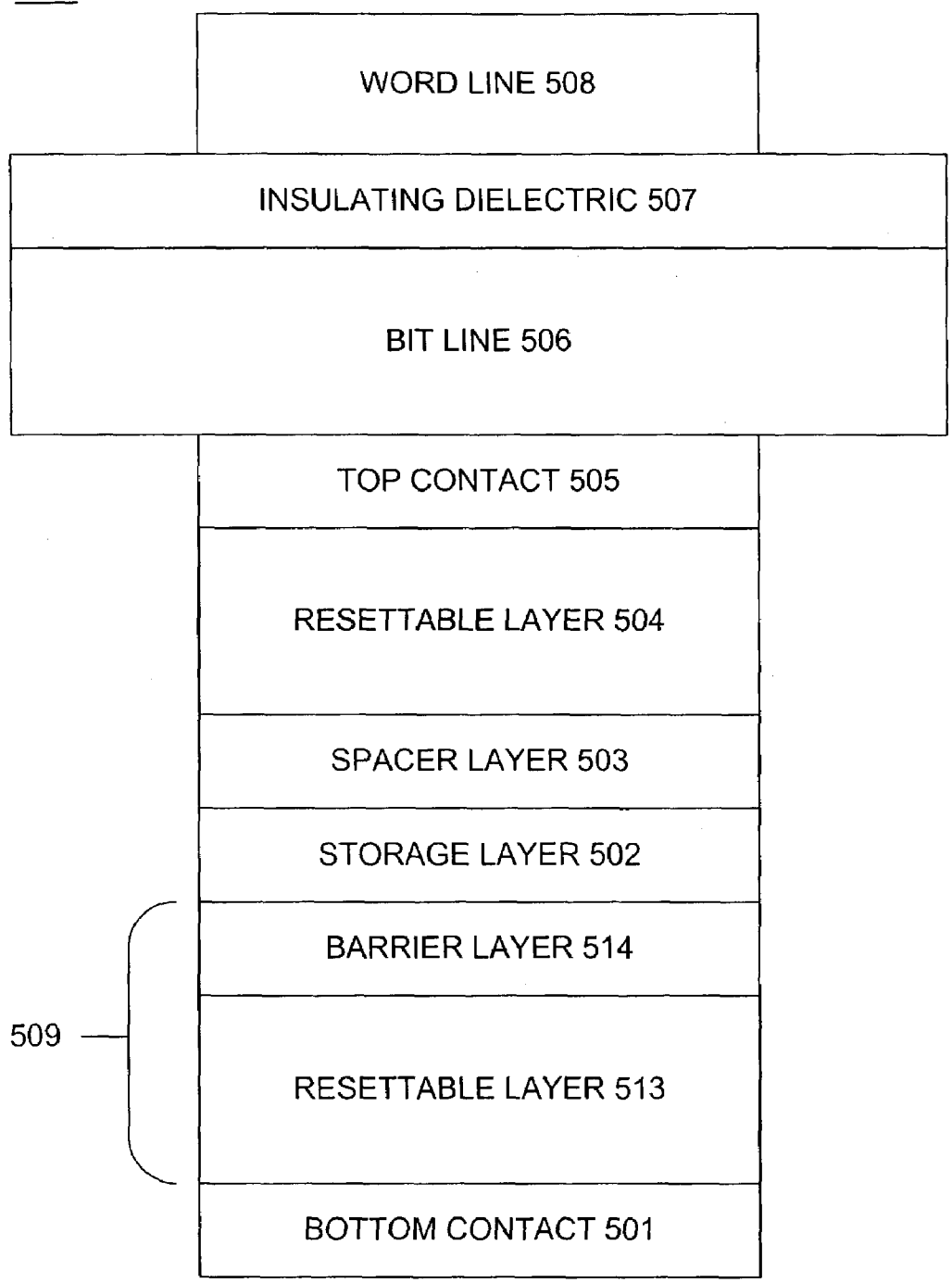
FIG. 5 shows a third exemplary embodiment of a spin-transfer stack device having Double Resettable Layers (DRL) Structure according to the present invention.

FIG. 5 shows a third exemplary embodiment of a spin-transfer stack device 500 having double resettable layers according to the present invention. Exemplary spin-transfer stack device 500 will generally be referred to herein as a Dual Structure With Double Resettable Layers device or, for short, a Double Resettable Layers (DRL) Structure device. Exemplary DRL Structure device 500 includes a bottom contact (or lead) 501, a (second) resettable layer 513, a barrier layer 514, a storage layer 502, a conductive spacer layer 503, a (first) resettable layer 504, and a top contact layer (or lead) 505. FIG. 5 also shows a bit line 506 formed on top contact layer 505, an insulating dielectric layer 507 formed on bit line 506, and a word line 508 formed on dielectric layer 507.

As shown in FIG. 5, exemplary DRL Structure device 500 is similar to exemplary Basic Structure device 300 except that the layer separating storage layer 502 and resettable layer 504 is preferably a conducting spacer layer 503 (although layer 503 can alternatively be a tunneling barrier layer); and that a multilayer structure 509 is formed between storage layer 502 and bottom contact 501. The portions of exemplary DRL Structure device 500 that are similar to exemplary Basic Structure device 300 are described above in connection with Basic Structure device 300. Multilayer structure 509 includes a barrier layer 514 and a (second) resettable layer 513 which allows for non-destructive read operations (without the need for reference cells) that are less time-consuming than read operations for a Dual Structure device. Resettable layer 513 can be similar to resettable layer 504 in having a high magnetic softness and similar geometrical shape. The magnetic moment of resettable layer 513 (which is proportional to the thickness), however, must be different from the magnetic moment of resettable layer 504 so that when the magnetizations of both layers 504 and 513 are aligned antiparallel, the net moment from the two layers is non-zero. In general, resettable layers 513 and 504 should be antiferromagnetically aligned because of strong dipolar coupling, resulting in the two layers switching or rotating in an external field together as a pair. A non-zero net moment allows the two antiparallel resettable layers to be manipulated by an external magnetic field.

A write operation for a DRL Structure device is identical to a write operation for a Basic Structure device. A forward-bias switching current flow is preferred at all times, although the reverse-bias switching current flow would still cause switching, albeit less effectively. A forward-bias current for a DRL Structure device flows from storage layer 502 to first resettable layer 504.

A read operation of a DRL Structure device is non-destructive and is similar to a read operation for a Basic Structure device, except that the read signal is generated primarily from the voltage drop across tunneling barrier layer 514 between storage layer 502 and resettable layer 513.

Figure 6:
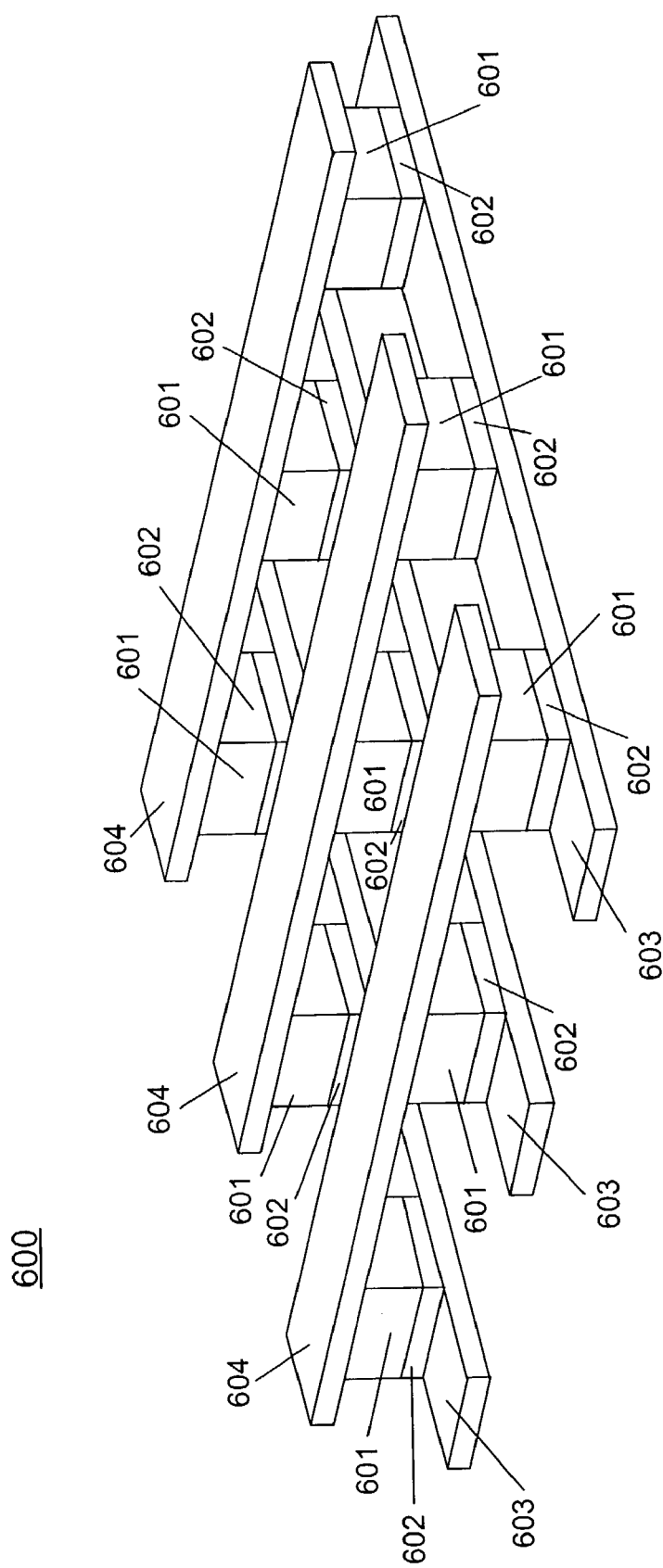
FIG. 6 is a schematic diagram of an exemplary array of memory cells formed from spin-transfer stack devices configured as any of the Basic Structure, Dual Structure and/or DRL Structure devices according to the present invention.

FIG. 6 is a schematic diagram of an exemplary array 600 of memory cells formed from spin-transfer stack devices configured as any of the Basic Structure, Dual Structure and/or DRL Structure devices according to the present invention. Array 600 includes a plurality of memory cells 601 formed on a plurality of uni-directional elements 602, which in turn are formed on a plurality of parallel bottom lead lines 603. Bottom lead lines 603 are typically formed from a semiconductor material. A plurality of parallel bit lines 604 are shown formed on memory cells 601 extending in a direction that is perpendicular to the direction that bottom lead lines 603 extend. A plurality of word lines (not shown in FIG. 6) can be formed on bit lines 604 and separated from bit lines 604 by a dielectric (not shown in FIG. 6). (See FIGS. 3-5). The word lines can extend parallel to bit lines 604, or in a direction that is not parallel to bit lines 604. Each of memory cells 601 includes a spin-transfer stack device configured as a Basic Structure device, a Dual Structure device or a DRL Structure device. Accordingly, each memory cell 601 can be configured as any of the alternative configurations of a Basic Structure device, a Dual Structure device and a DRL Structure device. As described, uni-directional elements 602, such as diodes, provide a cell-selection function. Alternatively, exemplary array 600 can be formed without uni-directional elements 602.

The following exemplary alternative configurations are applicable individually or in combination to each of the Basic Structure device, Dual Structure device or DRL Structure device.

The storage layer can be formed from a synthetic anti-ferromagnet having zero or small net magnetic moment so that the storage layer is immune or less susceptible to stray and external fields. Furthermore, a synthetic storage layer with or without an externally applied magnetic field (generated by nearby currents) can potentially help reduce the size of the critical switching current.

The interface between a resettable layer and an adjacent barrier layer or a spacer layer can be coated with a thin layer of high spin-polarization material, including half-metallic material, for increasing the spin-transfer effect, yet not significantly affecting the original magnetic switching or rotating field of the (total) resettable layer(s).

The word line can be eliminated altogether to simplify processing. Here, the top contact layer can be used both as a bit line and a word line. For spin-transfer stacks with resettable layers having anisotropy that is too weak for fixing the magnetization direction in zero magnetic field, however, the top contact layer would need to be used as both a bit and a word line simultaneously during a read operation or a write operation. Alternatively, a word line can be used as a write line, whereas the top contact layer can be used as both a bit and a word line. The additional field generated by the write line would help reset the direction of the magnetization of the resettable layer. Furthermore, by varying the respective contributions of the two fields from a perpendicularly crossing write line and word line, the net magnetic field can be adjusted to point in any arbitrary direction within the plane of the two lines. As yet another alternative, a write line and a word line that are perpendicularly crossing can be independently formed and electrically insulated from the spin-transfer stack. The top contact layer is then used only as a bit line.

A soft magnetic keeper layer having a geometrical pattern that is similar to the pattern of the resettable layer can be formed over all of the top contact layer, word line (if used), and write line (if used). The material and thickness of the keeper layer should be chosen so that the magnetic moment of the keeper layer is equal to the moment of the resettable layer in a Basic or Dual Structure device, or to the net moment of the two resettable layers in a DRL Structure device. When an external field is generated by currents running through the word line and write line (if used), the moment of the keeper layer points antiparallel to the moment (or net moment) of the resettable layer (or layers in a DRL Structure device) and, hence, the fields cancel.

Other variations of a Basic Structure device, a Dual Structure device, a DRL Structure device, and their alternative configurations include inverting the spin-transfer stacks, moving the word line and/or the write line to the bottom of the spin-transfer stack.

A uni-directional element, such as a diode, can be used in series with each of the Basic Structure, Dual Structure and DRL Structure devices of the present invention for performing a cell-selection function. Alternatively, a transistor can be used for providing a cell-selection function. When a uni-directional element is used with a spin-transfer stack, the current is applied only in one direction, preferably in the forward-bias switching mode direction. Use of a uni-directional element, such as a diode, can decrease process complexity, reduce cell size and/or enhance performance.

The storage layer of each Structure of the present invention can be formed with more than one easy axis, with each easy axis storing one bit of information, for example, with a "1" in one easy axis direction and a "0" in the opposite easy axis direction. One technique for providing more than one easy axis is by choosing a suitable magnetic material having more than one easy axis, such as cubic Fe, which has three easy axes along the cube edges. The magnetization direction of a multi-anisotropic storage layer can be switched into any of the easy axes of the storage layer using a combination of fields generated from at least two crossing lines, such as a word line and a write line, as described above.

When the storage layer for each of the Basic Structure, Dual Structure, and DRL Structure devices is formed with more than one easy axis, the (destructive and non-destructive) multi-bit reading operation is the same as that for the single-bit reading operation, except that the initial (stored) magnetization of the storage layer can now assume more than only two (opposite) directions, giving rise to more than only two voltage drops (or resistance values), thereby providing a multi-bit memory cell. The initial reading value with the magnetization of the storage layer pointing in a certain direction is now compared to the reading value with the magnetization of the storage layer pointing in a pre-selected direction. Alternatively, when using a reference read cell, the initial reading value with the storage layer's magnetization pointing in a certain direction is compared to the reading value of the reference read cell with its storage layer's magnetization pointing in a predetermined direction.

Although the number of layers, materials, and thicknesses are different, the patterning, lead and bit/word/write lines formation are similar for each of the three different Structure devices and their respective alternative configurations of the present invention.

Figure 7:
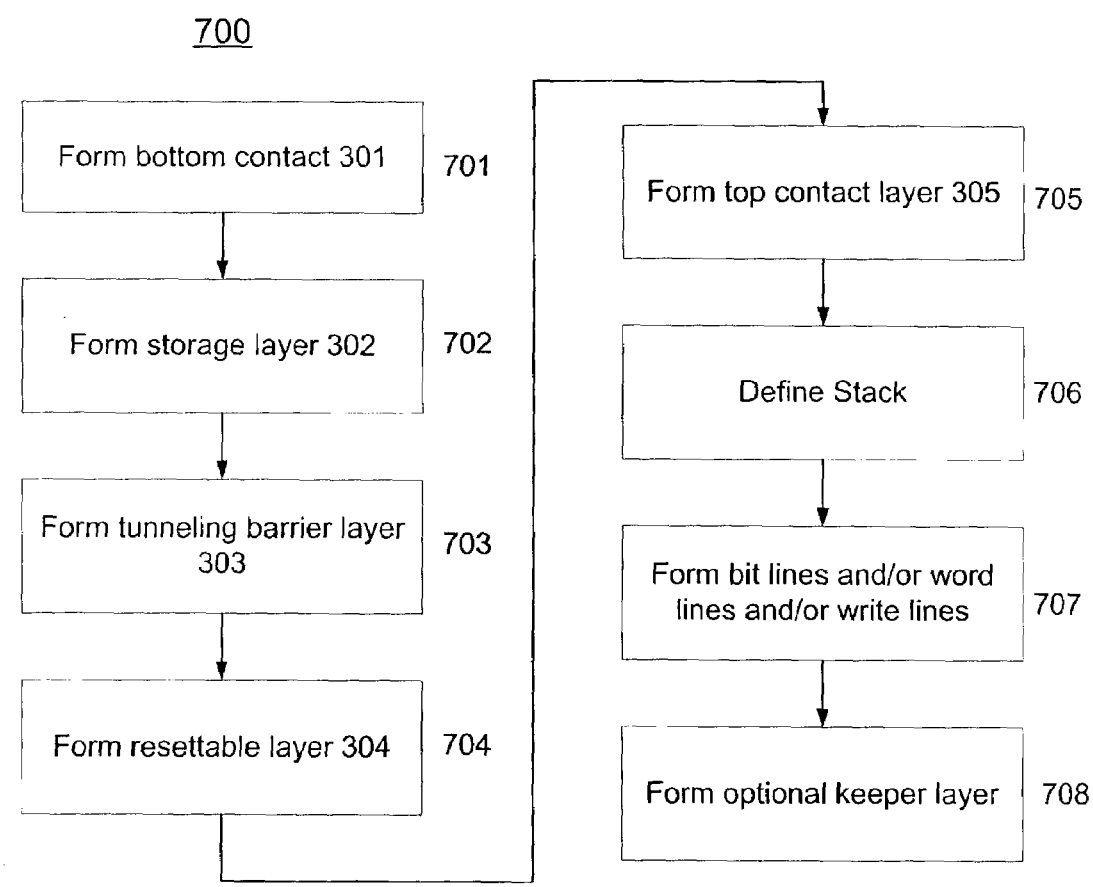
FIG. 7 shows a flow diagram for a fundamental process for producing a Basic Structure device according to the present invention.

FIG. 7 shows a flow diagram 700 for a fundamental process for producing a Basic Structure device according to the present invention, as shown in FIG. 3. At step 701, a metallic conductor, such as Cu, is formed in a well-known manner on a seed layer (not shown in FIG. 3) as bottom contact layer 301. At step 702, storage layer 302 is deposited in a well-known manner on bottom contact layer 301. Storage layer 302 can be formed from, for example, Co, Ni, Fe, and their respective alloys. Alternatively, storage layer 302 can be formed from a half-metallic material. The thickness of storage layer 302 is preferably 10–50 Å or less. Furthermore, it is preferred that the storage layer is synthetic.

At step 703, tunneling barrier layer 303 is deposited in a well-known manner on storage layer 302. Tunneling barrier layer 303 can be formed from alumina $Al_2O_3$ or other non-magnetic insulator, and should have a thickness that is less than about 10 Å. The thickness of tunneling barrier layer 303 is adjusted so that the resistance across the tunneling barrier is sufficiently small. At step 704, resettable layer 304 is deposited on tunneling barrier layer 303 in a well-known manner. Resettable layer 304 should be formed from a very soft magnetic material, such as FeZr. Resettable layer 304 should be thicker than storage layer 302, preferably in the range of 100–300 Å, so that the spin-transfer switching affects only storage layer 302, but not resettable layer 304.

As an alternative embodiment, the interface between resettable layer 304 and barrier layer 303 can be coated, or dusted, with a thin film of high polarization material, such as a half-metallic material, for enhancing the spin-transfer switching effect and the tunneling magnetoresistance.

At step 705, top contact layer 305 is deposited in a well-known manner on resettable layer 304 using a metallic conductor, such as Cu or Ta. Top contact layer 305 is optional and serves to protect the layers below from the subsequent patterning steps. At step 706, the stack is then defined using well-known techniques, including lithography, ion milling or etching of the surrounding material, and back-filling with a dielectric material. At step 707, the bit lines and/or word lines and/or write lines are then formed using a well-known technique.

At step 708, a magnetic keeper layer of similar soft magnetic material and shape as the resettable layer 304 can be optionally deposited and patterned on top of the top contact layer 305, bit and/or word and/or write lines. This magnetic keeper layer accepts the return flux from resettable layer 304 because the keeper layer is antiferromagnetically coupled to resettable layer 304 through dipolar interaction. The thickness of the keeper layer can be chosen so that its magnetic moment is equal to and cancels that of resettable layer 304.

In order to reduce or eliminate the magnetic shape anisotropy of the resettable layers, it is preferred that the resettable layers have an isotropic shape, such as round. On the other hand, the storage layer preferably should have an anisotropic shape, such as oblong. When two different shapes are formed, at least two patterning steps are required for each Structure of the present invention.

Figure 8:
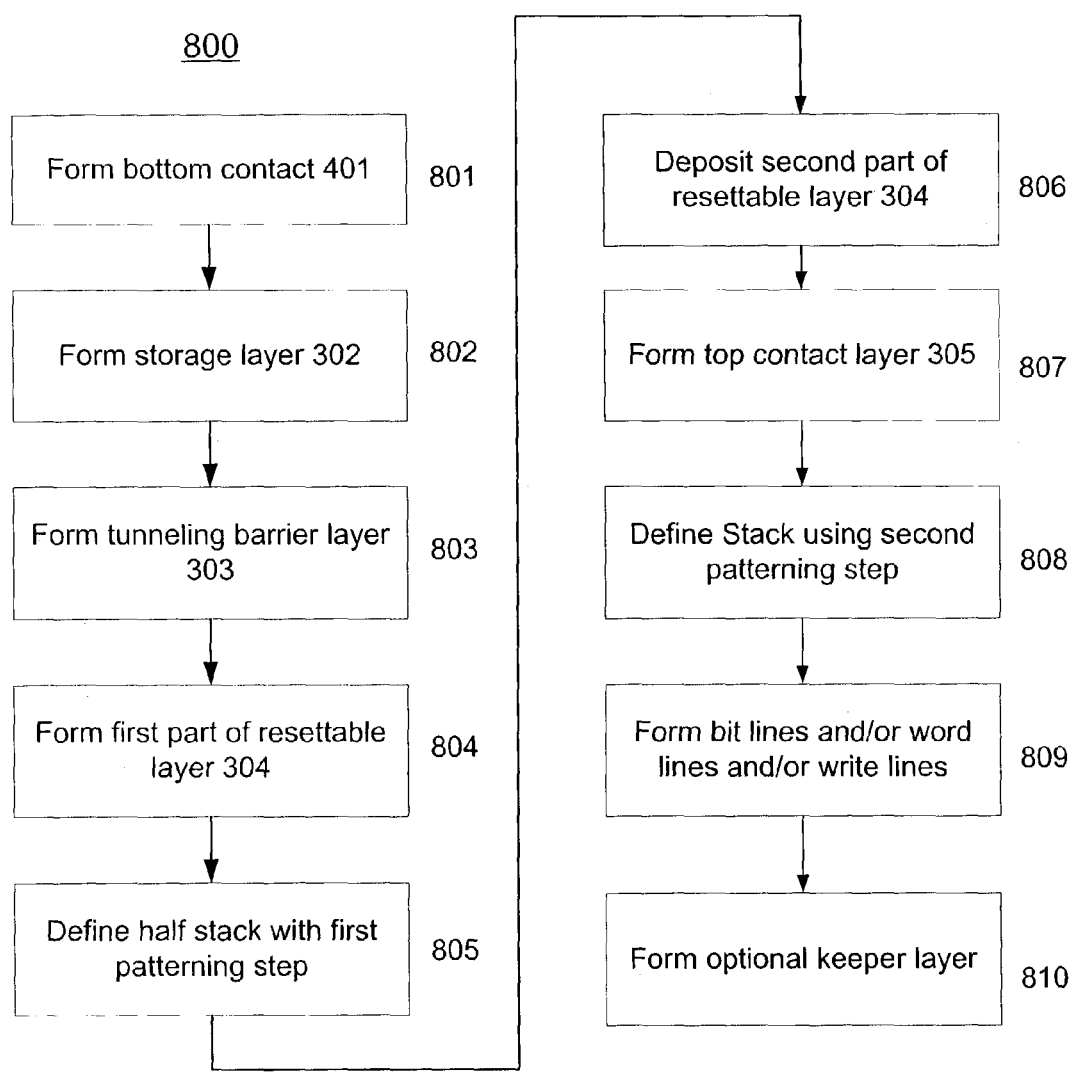
FIG. 8 shows a flow diagram for a process for producing a Basic Structure device having a patterned storage layer and a patterned resettable layer according to the present invention.

FIG. 8 shows a flow diagram 800 for a process for producing a Basic Structure device having a patterned storage layer and a patterned resettable layer according to the present invention, as shown in FIG. 3. At step 801, a metallic conductor, such as Cu, is formed in a well-known manner on a seed layer (not shown in FIG. 3) as bottom contact layer 301. At step 802, storage layer 302 is deposited in a well-known manner on bottom contact layer 301. Storage layer 302 can be formed from, for example, Co, Ni, Fe, and their respective alloys. Alternatively, storage layer 102 can be formed from a half-metallic material. The thickness of storage layer 302 is preferably 10–50 Å or less. Preferably, the storage layer can be synthetic.

At step 803, tunneling barrier layer 303 is deposited in a well-known manner on storage layer 302. Tunneling barrier layer 303 can be formed from alumina $Al_2O_3$ or other non-magnetic insulator, and should have a thickness that is less than about 10 Å. The thickness of tunneling barrier layer 303 is adjusted so that the resistance across the tunneling barrier is sufficiently small. At step 804, a first part of resettable layer 304 is deposited on tunneling barrier layer 303 in a well-known manner. Resettable layer 304 is formed from a very soft magnetic material, such as FeZr. Resettable layer 304 should be thicker than storage layer 302, preferably in the range of 100–300 Å, so that the spin-transfer switching affects only storage layer 302, but not resettable layer 304. As an alternative embodiment, the interface between resettable layer 304 and barrier layer 303 can be coated, or dusted, with a thin film of high polarization material, such as a half-metallic material, for enhancing the spin-transfer switching effect and the tunneling magnetoresistance.

At step 805, the half stack is then defined using well-known techniques, including lithography, ion milling or etching of the surrounding material, and back-filling with a dielectric material. This patterning step provides storage layer 302 with an anisotropic shape. At step 806, the second part of resettable layer 304 is deposited using a well-known technique and the same soft magnetic material, such as FeZr, with a thickness preferably in the range of about 100–300 Å. At step 807, top contact layer 305 is deposited in a well-known manner on resettable layer 304 using a metallic conductor, such as Cu or Ta. Top contact layer 305 is optional and serves to protect the layers below from subsequent patterning steps.

At step 808, the stack is then defined using well-known techniques, including lithography, ion milling or etching of the surrounding material, and back-filling with a dielectric material. This step provides resettable layer 304 with an isotropic shape that is chosen to be slightly larger than the anisotropic shape of storage layer 303. At step 809, bit lines and/or word lines and/or write lines are then formed using a well-known technique.

At step 810, a magnetic keeper layer of similar soft magnetic material and shape as the resettable layer 304 can be optionally deposited and patterned on top of the top contact layer, bit and/or word and/or write lines. The magnetic keeper layer accepts the return flux from resettable layer 304 because the keeper layer is antiferromagnetically coupled to resettable layer 304 through dipolar interaction. The thickness of the keeper layer can be chosen so that its magnetic moment is equal to and cancels that of resettable layer 304.

For the alternative configuration of a Basic Structure device having a patterned storage layer and a patterned resettable layer in which the spin-transfer stack is inverted, such that resettable layer 304 is located toward the bottom of the stack and storage layer 302 is located toward the top of the stack, the fabrication steps are similar with two different patterning steps (i.e., steps 705 and 708) interfacing inside thick resettable layer 304.

Figure 9:
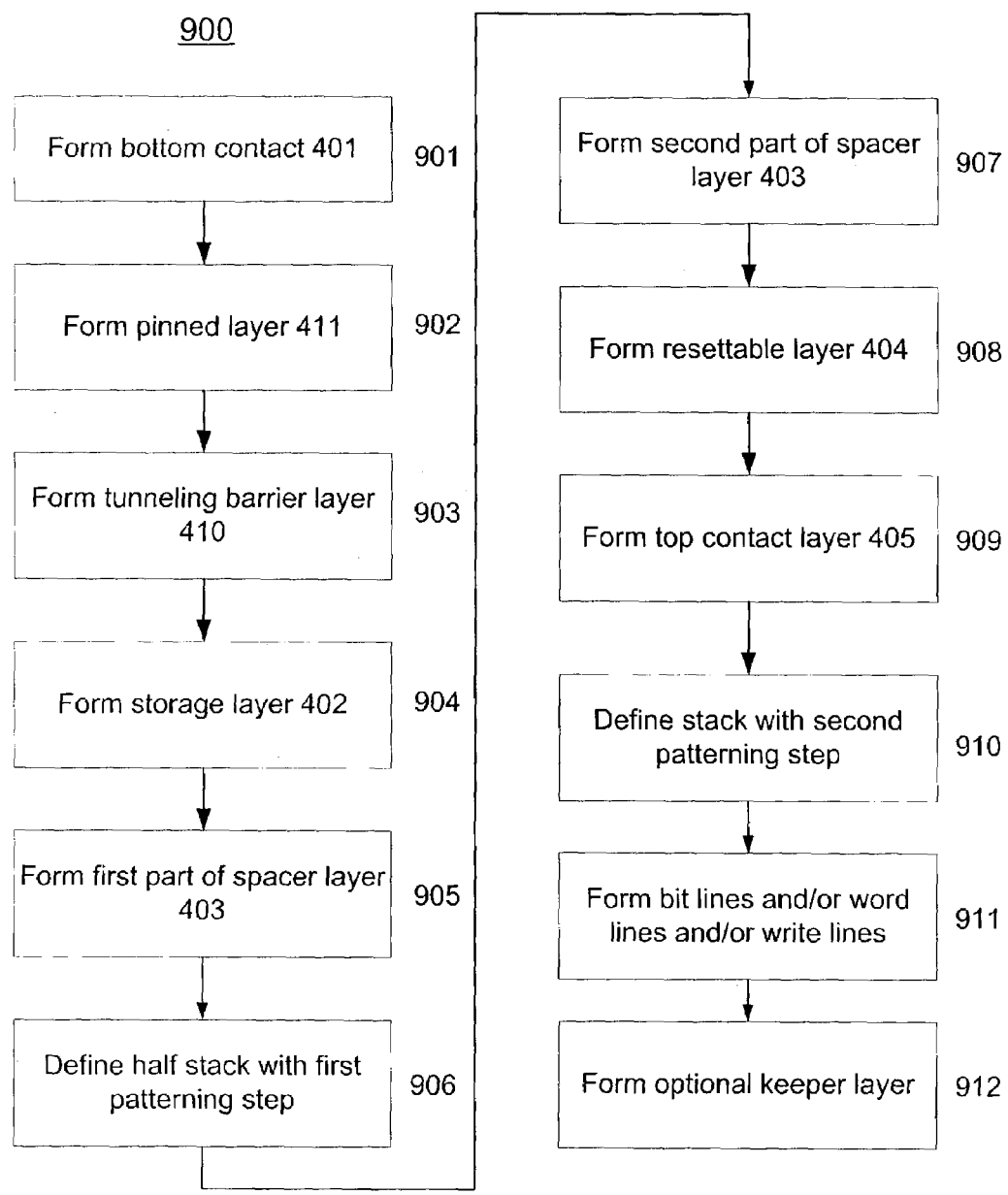
FIG. 9 shows a flow diagram for a process for producing a Dual Structure device according to the present invention.

FIG. 9 shows a flow diagram 900 for a process for producing a Dual Structure device according to the present invention, as shown in FIG. 4. At step 901, a seed layer (not shown in FIG. 4) and antiferromagnetic layer 412 are deposited in a well-known manner, such as by sputtering. Antiferromagnetic layer 412 is formed from an antiferromagnetic material, such as PtMn, at 160 Å thickness. (The minimum thickness depends on the antiferromagnetic material used.) At step 902, pinned layer 411 is deposited in a well-known manner on antiferromagnetic layer 412, such as by sputtering. Pinned layer 411 is formed to be less that about 100 Å thick and formed from Co, CoFe or other ferromagnetic alloy. Preferably, pinned layer 411 is synthetic.

At step 903, tunneling barrier layer 410 is deposited on pinned layer 411 in a well-known manner. Tunneling barrier layer 410 is formed to be less than about 10 Å thick and formed from alumina $Al_2O_3$ or other non-magnetic insulator. The thickness of tunneling barrier layer 410 is adjusted so that the resistance across tunneling barrier layer 410 is sufficiently small. At step 904, storage layer 402 is deposited in a well-known manner on tunneling barrier layer 410. Storage layer 402 can be formed from, for example, Co, Ni, Fe, and their respective alloys. Alternatively, storage layer 402 can be formed from a half-metallic material. The thickness of storage layer 402 is preferably between 10–50 Å or less. Preferably, the storage layer is synthetic.

At step 905, the first part of spacer layer 403, about 30–60 Å thick from Cu, for example, is deposited in a well-known manner on tunneling barrier layer 410. Optionally, a Chemical Mechanical Polishing (CMP) stop layer, formed to be about 50 Å and formed from, for example, Ta, can be deposited on spacer layer 403. At step 906, the half stack is then defined using well-known techniques, including lithography, ion-milling or etching of the surrounding material, and back-filling with a dielectric material, followed by CMP. This patterning step provides storage layer 402 and pinned layer 411 with an anisotropic shape.

At step 907, the second part of spacer layer 403 is deposited. The second part of spacer layer 403 is formed to be about 20–40 Å thick and from, for example, Cu. With the two parts of the spacer layer and the optional thin CMP stop layer (which may be optionally removed before depositing the second part of the spacer layer), the total thickness of spacer layer 403 can be up to several hundred Angstroms thick. Regardless, the spin diffusion lengths of some spacer materials can be much larger (for example, approximately 1000 Å for Cu), consequently, the spin-transfer switching effect should not be significantly compromised. At step 908, resettable layer 404 is deposited in a well-known manner on spacer layer 403. Resettable layer 404 is formed from a very soft magnetic material, such as FeZr. Resettable layer 404 should be thicker than storage layer 402, preferably in the range of about 100–300 Å, so that the spin-transfer switching affects only storage layer 402, but not resettable layer 404. As an alternative embodiment, the interface between resettable layer 404 and spacer layer 403 can be coated, or dusted, with a thin film of high polarization material, such as a half-metallic material, for enhancing the spin-transfer switching effect and the tunneling magnetoresistance.

At step 909, top contact layer 405 is deposited in a well-known manner on resettable layer 404 using a metallic conductor, such as Cu or Ta. Top contact layer 405 is optional and serves to protect the layers below from subsequent patterning steps. At step 910, the stack is then defined using well-known techniques, including lithography, ion milling or etching of the surrounding material, and back-filling with a dielectric material. This step provides resettable layer 404 with an isotropic shape. At step 911, the bit lines and/or word lines and/or write lines are then formed using a well-known technique.

At step 912, a magnetic keeper layer of similar soft magnetic material and shape as the resettable layer 404 can be optionally deposited and patterned on top of the top contact layer 405, bit and/or word and/or write lines. The magnetic keeper layer accepts the return flux from resettable layer 404 because the keeper layer is antiferromagnetically coupled to resettable layer 404 through dipolar interaction. The thickness of the keeper layer can be chosen so that its magnetic moment is equal to and cancels that of resettable layer 404.

For the alternative configuration of a Dual Structure device in which the spin-transfer stack is inverted such that resettable layer 404 is located towards the bottom of the stack (as shown in FIG. 4 for the non-inverted arrangement) and storage layer 402 (and pinned layer 411) are located toward the top of the stack, the fabrication steps are somewhat different although the two different patterning steps still interface inside the thick spacer layer, as follows. The entire stack is deposited without halfstack patterning. That is, stack is formed from bottom to top with bottom contact 401, resettable layer 404, spacer layer (approximately 100–300 Å thick), storage layer 402, barrier layer 410, pinned layer 411, antiferromagnetic layer 412 and top contact layer 405. Then, a first patterning is performed for providing resettable layer 404 (and all other layers) with an isotropic shape. Subsequently, a partial patterning is performed for providing only storage layer 402 (and pinned layer 411) with an anisotropic shape. The partial patterning is achieved by ion milling only to the middle of thick spacer layer 403. Optionally, a thin ion milling stop layer (of lower ion milling rate) can be inserted inside thick spacer layer 403 to help stop the ion milling in the middle of the spacer layer 403.

Because spacer layer 403 is nonmagnetic, the patterning interface inside spacer layer 403 is less likely to give rise to complications than the patterning interface formed inside magnetic resettable layer 304 in a Basic Structure device, thereby providing an advantage over a Basic Structure device.

Figure 10:
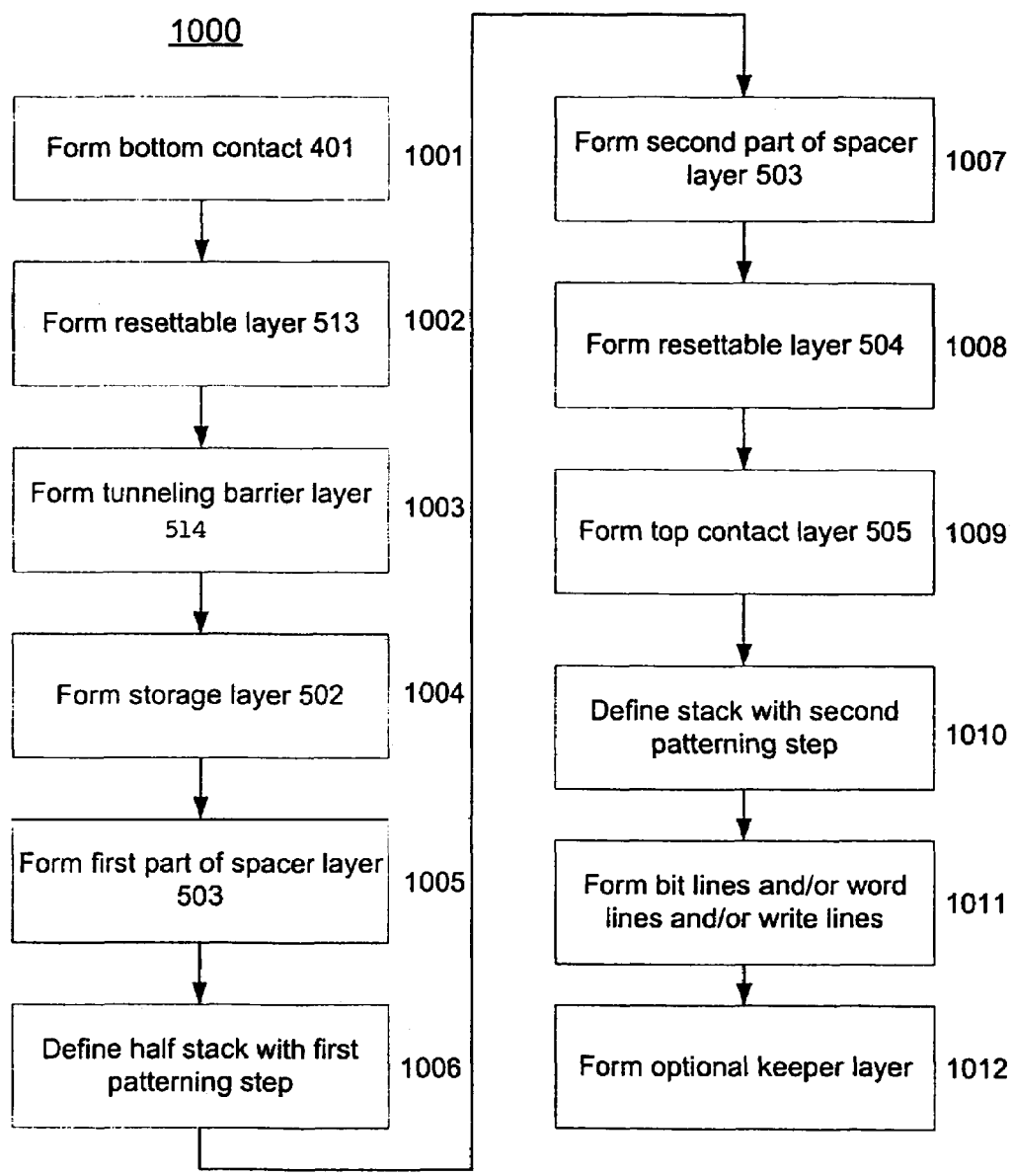
FIG. 10 shows a flow diagram for a process for producing a DRL Structure device according to the present invention.

FIG. 10 shows a flow diagram 1000 for a process for producing a DRL Structure device according to the present invention, as shown in FIG. 5. At step 1001, a metallic conductor, such as Cu, is formed in a well-known manner on a seed layer (not shown in FIG. 5) as bottom contact layer 501. At step 1002, resettable layer 513 is deposited in a well-known manner on bottom contact layer 501. Resettable layer 513 is formed to be in the range of about 100–300 Å thick, and formed from a very soft magnetic material, such as FeZr. Resettable layer 513 should be thicker than storage layer 502 so that the spin-transfer switching affects only storage layer 502, but not resettable layer 513. As an alternative embodiment, resettable layer 504 can be coated, or dusted, with a thin film of high polarization material, such as a halfmetallic material, for enhancing the tunneling magnetoresistance.

At step 1003, tunneling barrier layer 514 is deposited in a well-known manner on resettable layer 513. Tunneling barrier layer 514 can be formed from alumina $Al_2O_3$ or other non-magnetic insulator, and should have a thickness that is less than about 10 Å. The thickness of tunneling barrier layer 514 is adjusted so that the resistance across the tunneling barrier is sufficiently small. At step 1004, storage layer 502 is deposited in a well-known manner on tunneling barrier layer 514. Storage layer 502 can be formed from, for example, Co, Ni, Fe, and their respective alloys. Alternatively, storage layer 502 can be formed from a half-metallic material. The thickness of storage layer 502 is preferably 10–50 Å or less. Preferably, the storage layer is synthetic.

At step 1005, the first part of spacer layer 503 is deposited in a well-known manner on storage layer 502. Spacer layer 503 is formed to be about 30–60 Å thick and formed from, for example, Cu. Optionally, a CMP stop layer can be deposited on spacer layer 503 to help with subsequent patterning. At step 1006, the half stack is then defined using well-known techniques, such as lithography, ion-milling or etching, down to just past the interface between resettable layer 513 and barrier layer 514, and back-filling with a dielectric material, followed by CMP. This patterning step provides an anisotropic shape to the storage layer 502 (and to a small top portion of resettable layer 513).

At step 1007, the second part of spacer layer 503 is deposited. The second part of spacer layer 503 is formed to be about 20–40 Å thick and from, for example, Cu. With the two parts of the spacer layer and the optional thin CMP stop layer (which may be optionally removed before depositing the second part of the spacer layer), the total thickness of spacer layer 503 can be up to several hundred Angstroms thick. Regardless, the spin diffusion lengths of some spacer materials can be much larger (for example, approximately 1000 Å for Cu), consequently, the spin-transfer switching effect should not be significantly compromised.

At step 1008, resettable layer 504 is deposited in a well-known manner on spacer layer 503. Resettable layer 504 is formed from a very soft magnetic material, such as FeZr. Resettable layer 504 should be thicker than storage layer 502, preferably in the range of about 100–300 Å, so that the spin-transfer switching affects only storage layer 502, but not resettable layer 504. As an alternative embodiment, the interface between resettable layer 504 and spacer layer 503 can be coated, or dusted, with a thin film of high polarization material, such as a half-metallic material, for enhancing the spin-transfer switching effect and the tunneling magnetoresistance.

Resettable layer 504 should, at the end of processing, be similar to resettable layer 513 in its high magnetic softness, geometrical shape, and thickness. The magnetic moment of resettable layer 504 (which is proportional to the thickness of layer 504), however, must be different from resettable layer 513 so that when the magnetization of layers 513 and 504 are aligned antiparallel, the net moment from layers 513 and 504 is non-zero and, hence, can be manipulated by an external magnetic field. In fact, the magnetization of resettable layers 513 and 504 will likely be antiparallel because of strong dipolar coupling, resulting in layers 513 and 504 switching or rotating together in an external field as a pair.

At step 1009, top contact layer 505 is deposited in a well-known manner on resettable layer 504 using a metallic conductor, such as Cu or Ta. Top contact layer 505 is optional and serves to protect the layers below from subsequent patterning steps. At step 1010, the stack is then defined using well-known techniques, including lithography, ion milling or etching of the surrounding material down to bottom contact 501 and back-filling with a dielectric material. This step provides resettable layers 513 and 504 with an isotropic shape that is slightly larger than anisotropic shape of storage layer 502, while maintaining the anisotropic shape of storage layer 502. At step 1011, bit lines and/or word lines and/or write lines are then formed using a well-known technique.

At step 1012, a magnetic keeper layer of similar soft magnetic material and shape as resettable layers 513 and 504 can be optionally deposited and patterned on top of the lead, bit and/or word and/or write lines. The magnetic keeper layer accepts the return flux from resettable layers 513 and 504 because the keeper layer is antiferromagnetically coupled to resettable layers 513 and 504 through dipolar interaction. The thickness of the keeper layer can be chosen so that its magnetic moment is equal to and cancels the net moment of resettable layers 513 and 504.

Because spacer layer 303 of a Basic Structure device is nonmagnetic, the patterning interface inside spacer layer 303 is less likely to give rise to complications than an interface inside magnetic resettable layer 304 in the Basic Structure case. This is an advantage that a Dual Structure with Double Resettable Layers device has over a Basic Structure device.

The present invention has been described in terms of a particular magnetic memory and a particular magnetic element having certain components. It should be readily recognized that the present invention would operate effectively for other magnetic memory elements having different and/or additional components and other magnetic memories having different and/or other features that are not inconsistent with the present invention. The present invention has also been described in the context of current understanding of the spin-transfer phenomenon. Consequently, it should be readily recognized that theoretical explanations of the behavior of the method and system are made based upon the current understanding of the spin-transfer phenomenon. Further, it should be readily recognized that the method and system of the present invention are described in the context of a structure having a particular relationship to a substrate. It should be recognized, however, that the method and system of the present invention are consistent with other structures. For example, the magnetic portion of the Basic Structure described in FIG. 7 can be inverted with the resettable layer placed below the tunneling barrier layer and the storage layer placed above the tunneling barrier layer instead. Additionally, the method and system of the present invention are described in the context of certain layers being synthetic. It should also be recognized that other and/or additional layers could be synthetic.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A magnetic element, comprising:
   a resettable layer having a first magnetization that is set in a selected direction by at least one magnetic field, each magnetic field being generated externally to the resettable layer;
   a storage layer having at least one magnetic easy axis and having a second magnetization that changes direction based on a spin-transfer effect when a write current passes through the magnetic element; and
   a spacing layer formed between the resettable layer and the storage layer.

2. The magnetic element according to claim 1, wherein at least a portion of the storage layer is formed from one of a ferromagnetic material, a ferrimagnetic material, a sperimagnetic material, and a half-metallic material.

3. The magnetic element according to claim 1, wherein the storage layer is formed from a synthetic antiferromagnet.

4. The magnetic element according to claim 1, wherein the write current passes through the magnetic element only in a forward-bias switching mode direction.

5. The magnetic element according to claim 1, wherein the storage layer has at least one magnetic shape anisotropy.

6. The magnetic element according to claim 1, wherein the storage layer has a first shape and the resettable layer has a second shape that is different from the first shape.

7. The magnetic element according to claim 6, wherein the storage layer has a shape that induces at least one magnetic shape anisotropy and the resettable layer has a magnetically isotropic shape.

8. The magnetic element according to claim 1, wherein at least a portion of the resettable layer is formed from one of a ferromagnetic material, a ferrimagnetic material, a sperimagnetic material, and a half-metallic material.

9. The magnetic element according to claim 1, wherein the resettable layer is formed to have a magnetization that is set in a desired direction using an external magnetic field that is less than about 20 Oe.

10. The magnetic element according to claim 1, wherein the resettable layer is formed from a synthetic antiferromagnet.

11. The magnetic element according to claim 1, wherein the spacing layer is a tunneling barrier layer.

12. The magnetic element according to claim 11, further comprising a layer of high spin-polarization material formed between the resettable layer and the tunneling barrier layer.

13. The magnetic element according to claim 1, wherein the spacing layer is a conductive spacer layer.

14. The magnetic element according to claim 13, further comprising a layer of high spin-polarization material formed between the resettable layer and the conductive spacer layer.

15. The magnetic element according to claim 1, further comprising an electrical uni-directional element connected in electrical series with the storage layer and the resettable layer.

16. The magnetic element according to claim 1, wherein the storage layer has a first side and a second side, the first side of the storage layer being closer to the resettable layer than the second side of the storage layer, and
the magnetic element further comprising a multilayer structure formed on the second side of the storage layer.

17. The magnetic element according to claim 16, further comprising an electrical uni-directional element connected in electrical series with the storage layer and the multilayer structure.

18. The magnetic element according to claim 16, wherein the multilayer structure includes:
a second spacing layer formed adjacent to the storage layer;
a pinned magnetic layer having a third magnetization; and
an antiferromagnetic layer.

19. The magnetic element according to claim 18, wherein the second spacing layer is a tunneling barrier.

20. The magnetic element according to claim 18, wherein the second spacing layer is a conductive spacer layer.

21. The magnetic element according to claim 18, wherein the pinned magnetic layer is a synthetic antiferromagnet.

22. The magnetic element according to claim 16, wherein the multilayer structure includes:
a tunneling barrier layer formed adjacent to the storage layer; and
a second resettable layer having a third magnetization, the second resettable layer having a magnetic moment that is different from a magnetic moment of the resettable layer having the first magnetization.

23. The magnetic element according to claim 22, wherein the second resettable layer has a magnetically isotropic shape.

24. The magnetic element according to claim 22, wherein the second resettable layer is formed to have a magnetization that is set in a desired direction using an external magnetic field that is less than about 20 Qe.

25. The magnetic element according to claim 22, wherein the second resettable layer is a synthetic antiferromagnet.

26. The magnetic element according to claim 22, wherein the first magnetization of the resettable layer and the third magnetization of the second resettable layer are set in a selected direction by at least one magnetic field, each magnetic field being generated by a current that is external to the magnetic element.

27. A magnetic memory having a plurality of magnetic cells, at least one magnetic cell including a magnetic element comprising:
a resettable layer having a first magnetization that is set in a selected direction by at least one magnetic field, each magnetic field being generated externally to the resettable layer;
a storage layer having at least one magnetic easy axis and having a second magnetization that changes direction based on a spin-transfer effect when a write current passes through the magnetic element; and
a spacing layer formed between the resettable layer and the storage layer.

28. The magnetic memory according to claim 27, wherein at least a portion of the storage layer is formed from one of a ferromagnetic material, a ferrimagnetic material, a sperimagnetic material, and a half-metallic material.

29. The magnetic memory according to claim 27, wherein the storage layer is formed from a synthetic antiferromagnet.

30. The magnetic memory according to claim 27, wherein the write current passes through the magnetic element in only a forward-bias switching mode direction.

31. The magnetic memory according to claim 27, wherein the storage layer has at least one magnetic shape anisotropy.

32. The magnetic memory according to claim 27, wherein the storage layer has a first shape and the resettable layer has a second shape that is different from the first shape.

33. The magnetic memory according to claim 32, wherein the storage layer has a shape that induces at least one magnetic shape anisotropy and the resettable layer has a magnetically isotropic shape.

34. The magnetic memory according to claim 27, wherein at least a portion of the resettable layer is formed from one of a ferromagnetic material, a ferrimagnetic material, a sperimagnetic material, and a half-metallic material.

35. The magnetic memory according to claim 27, wherein the resettable layer is formed from a magnetic material having a magnetization that is set in a desired direction using an external magnetic field that is less than about 20 Oe.

36. The magnetic memory according to claim 27, wherein the resettable layer is formed from a synthetic antiferromagnet.

37. The magnetic memory according to claim 27, wherein the spacing layer is a tunneling barrier.

38. The magnetic memory according to claim 37, further comprising a layer of high spin-polarization material formed between the resettable layer and the tunneling barrier layer.

39. The magnetic memory according to claim 37, wherein the spacing layer is a conductive spacer layer.

40. The magnetic memory according to claim 39, further comprising a layer of high spin-polarization material formed between the resettable layer and the conductive spacer layer.

41. The magnetic memory according to claim 27, further comprising an electrical uni-directional element connected in electrical series with the storage layer and the resettable layer.

42. The magnetic memory according to claim 27, wherein the storage layer has a first side and a second side, the first side of the storage layer being closer to the resettable layer than the second side of the storage layer, and the magnetic element further comprising a multilayer structure formed on the second side of the storage layer.

43. The magnetic memory according to claim 42, further comprising an electrical uni-directional element connected in electrical series with the storage layer and the multilayer structure.

44. The magnetic memory according to claim 42, wherein the multilayer structure includes:
a second spacing layer formed adjacent to the storage layer,
a pinned magnetic layer having a third magnetization; and
an antiferromagnetic layer that pins the third magnetization in a predetermined direction.

45. The magnetic memory according to claim 44, wherein the second spacing layer is a tunneling barrier.

46. The magnetic memory according to claim 44, wherein the second spacing layer is a conductive spacer layer.

47. The magnetic memory according to claim 44, wherein the pinned magnetic layer is a synthetic antiferromagnet.

48. The magnetic memory according to claim 42, wherein the multilayer structure includes:

a tunneling barrier layer formed adjacent to the storage layer; and a second resettable layer having a third magnetization, the second resettable layer having a magnetic moment that is different from a magnetic moment of the resettable layer having the first magnetization.

49. The magnetic memory according to claim 48, wherein the second resettable layer has a magnetically isotropic shape.

50. The magnetic memory according to claim 48, wherein the second resettable layer is formed from a magnetic material having a magnetization that is set in a desired direction using an external magnetic field that is less than about 20 Oe.

51. The magnetic memory according to claim 48, wherein the second resettable layer is a synthetic antiferromagnet.

52. The magnetic memory according to claim 48, wherein the first magnetization of the resettable layer and the third magnetization of the second resettable layer are set in the selected direction by at least one magnetic field, each magnetic field being generated a current that is external to the magnetic element.

53. A method for forming a magnetic element, the method comprising steps of:

forming a resettable layer having a first magnetization that is set in a selected direction by at least one magnetic field, each magnetic field being generated externally to the resettable layer;

forming a storage layer having at least one magnetic easy axis and having a second magnetization that changes direction based on a spin-transfer effect when a write current passes through the magnetic element; and forming a spacing layer between the resettable layer and the storage layer.

54. The method according to claim 53, further comprising a step of forming an electrical uni-directional element in electrical series with the storage layer and the multilayer structure.

55. The method according to claim 53, wherein the storage layer has a first side and a second side, the first side of the storage layer being closer to the resettable layer than the second side of the storage layer, the method further comprising a step of forming a multilayer structure on the second side of the storage layer.

56. The method according to claim 55, wherein the step of forming the multilayer structure includes steps of forming a second spacing layer adjacent to the storage layer, forming a pinned magnetic layer having the third magnetization; and forming an antiferromagnetic layer that pins the third magnetization in a predetermined direction.

57. The method according to claim 56, wherein the second spacing layer is a tunneling barrier layer.

58. The method according to claim 56, wherein the second spacing layer is a conductive spacer layer.

59. The method according to claim 55, wherein the step of forming the multilayer structure includes a step of forming a second resettable layer having a third magnetization, the second resettable layer having a magnetic moment that is different from a magnetic moment of the resettable layer having the first magnetization.

60. The method according to claim 53, wherein the storage layer is formed to have at least one magnetic shape anisotropy.

61. The method according to claim 53, wherein the storage layer is formed to have more than one easy magnetic axis.

62. The method according to claim 53, wherein the storage layer is formed to have a first shape and the resettable layer is formed to have a second shape that is different from the first shape.

63. The method according to claim 53, wherein the storage layer is formed to have a shape that induces at least one magnetic shape anisotropy and the resettable layer is formed to have a magnetically isotropic shape.

* * * * *